US012345522B2

(12) United States Patent
Okuyama et al.

(10) Patent No.: US 12,345,522 B2
(45) Date of Patent: Jul. 1, 2025

(54) COMPUTER SYSTEM, DIMENSION MEASUREMENT METHOD, AND STORAGE MEDIUM

(71) Applicant: HITACHI HIGH-TECH CORPORATION, Tokyo (JP)

(72) Inventors: Yutaka Okuyama, Tokyo (JP); Takeshi Ohmori, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/802,673

(22) PCT Filed: Jun. 14, 2021

(86) PCT No.: PCT/JP2021/022456
§ 371 (c)(1),
(2) Date: Aug. 26, 2022

(87) PCT Pub. No.: WO2022/264195
PCT Pub. Date: Dec. 22, 2022

(65) Prior Publication Data
US 2024/0200939 A1    Jun. 20, 2024

(51) Int. Cl.
G01B 21/04    (2006.01)
G06T 7/00    (2017.01)
(Continued)

(52) U.S. Cl.
CPC ............ *G01B 21/04* (2013.01); *G06T 7/0006* (2013.01); *G06T 7/60* (2013.01); *H01J 37/222* (2013.01);
(Continued)

(58) Field of Classification Search
CPC ....... G01B 21/04; G01B 11/03; G06T 7/0006; G06T 7/60
(Continued)

(56) References Cited

U.S. PATENT DOCUMENTS 7,548,321 B2 *   6/2009   Rinn ...................... G01B 11/03
                                                                356/500
7,626,163 B2 *  12/2009   Honda .................... H01J 37/28
                                                                250/311
(Continued)

FOREIGN PATENT DOCUMENTS

JP    2002-350127 A    12/2002
JP    2009-206453 A     9/2009
(Continued)

OTHER PUBLICATIONS

Search Report mailed Sep. 7, 2021 in International Application No. PCT/JP2021/022456.
(Continued)

Primary Examiner — George B Bennett
(74) Attorney, Agent, or Firm — Miles & Stockbridge, P.C.

(57) ABSTRACT

A computer system providing a function for: extracting, from image data of a semiconductor pattern, coordinate information of a base point for measuring a dimension of a desired location of the semiconductor pattern; and measuring the dimension using the coordinate information of the base point. The computer system includes a training device in which a pose estimation model for outputting coordinate information of at least two base points as a training result is implemented. The training device is trained in advance using teacher data having the image data of the semiconductor pattern as an input and the coordinate information of at least two base points as an output, and extracts, for new image data input into the training device, the coordinate information of at least two base points and a dimension.

15 Claims, 19 Drawing Sheets

(51) Int. Cl.
   *G06T 7/60* (2017.01)
   *H01J 37/22* (2006.01)
(52) U.S. Cl.
   CPC  *G01B 2210/56* (2013.01); *G06T 2207/30148* (2013.01); *H01J 2237/2817* (2013.01)
(58) Field of Classification Search
   USPC .......................................................... 33/503
   See application file for complete search history.

(56) References Cited

U.S. PATENT DOCUMENTS

| | | | |
|---|---|---|---|
| 7,910,885 B2 | 3/2011 | Rosenberg et al. | |
| 9,036,896 B2 * | 5/2015 | Touya | G06T 7/001 382/141 |
| 9,355,444 B2 * | 5/2016 | Nava | G06T 7/0006 |
| 10,325,361 B2 * | 6/2019 | Bhattacharyya | G06T 7/0006 |
| 10,559,506 B2 * | 2/2020 | Kim | G06T 7/0006 |
| 12,175,650 B2 * | 12/2024 | Neumann | G06F 16/55 |
| 2002/0181776 A1 | 12/2002 | Yutaka | |
| 2005/0116182 A1 | 6/2005 | Tanaka et al. | |
| 2006/0060774 A1 | 3/2006 | Mayuka et al. | |
| 2009/0212212 A1 | 8/2009 | Shishido et al. | |
| 2009/0231424 A1 | 9/2009 | Honda et al. | |
| 2016/0163035 A1 | 6/2016 | Chang et al. | |
| 2017/0177997 A1 | 6/2017 | Karlinsky et al. | |
| 2017/0372464 A1 * | 12/2017 | Kitamura | G06V 10/752 |
| 2018/0082873 A1 | 3/2018 | Ohmori et al. | |
| 2021/0035833 A1 | 2/2021 | Feng et al. | |
| 2021/0048794 A1 | 2/2021 | Moki et al. | |
| 2021/0264587 A1 * | 8/2021 | Kobayashi | G03F 7/70625 |
| 2021/0374936 A1 | 12/2021 | Koopman et al. | |
| 2022/0139788 A1 | 5/2022 | Okuyama et al. | |
| 2024/0193755 A1 * | 6/2024 | Choi | G06T 7/001 |
| 2024/0331132 A1 * | 10/2024 | Liang | G06T 7/74 |
| 2024/0331179 A1 * | 10/2024 | Klochkov | G01N 23/203 |

FOREIGN PATENT DOCUMENTS

| | | |
|---|---|---|
| JP | 2012-068138 A | 4/2012 |
| JP | 2014-052256 A | 3/2014 |
| JP | 2018-049936 A | 3/2018 |
| JP | 2018-506168 A | 3/2018 |
| JP | 2021-022250 A | 2/2021 |
| WO | WO2020121564 A1 | 6/2020 |

OTHER PUBLICATIONS

Written Opinion mailed Sep. 7, 2021 in International Application No. PCT/JP2021/022456.

Search Report mailed Oct. 1, 2019 in International Application No. PCT/JP2019/026595.

Office Action mailed Mar. 21, 2022 in U.S. Appl. No. 16/957,480.

Informal Comments and attachment items 1 and 2 submitted Nov. 17, 2021 in International Application No. PCT/JP2021/022456, and translations thereof, pp. 1-28.

* cited by examiner

Fig. 5

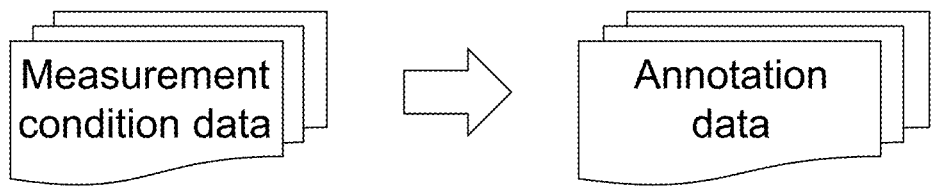

```
.....
{"name" : "mask_height",
        "measurementList" : [
        {"measumentName" : "L1", "positionList" :[{x1, y1}, {x2, y2}]},
        {"measumentName" : "L2", "positionList" :[{x9, y9}, {x10, y10}]}
        ]
},
{"name" : "trench_depth",
        "measurementList" : [
        {"measumentName" : "L3", "positionList" :[{x3, y3}, {x4, y4}]}
        ]
},
{"name" : "top_CD",
        "measurementList" : [
        {"measumentName" : "L4", "positionList" :[{x5, y5}, {x6, y6}]}
        ]
},
{"name" : "max_CD",
        "measurementList" : [
        {"measumentName" : "L5", "positionList" :[{x7, y7}, {x8, y8}]}
        ]
}
.....
```

```
"annotations": [
    {"keypoints" : [x1, y1, 2, x2, y2, 2, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0], "id" : 1000},
    {"keypoints" : [0, 0, 0, 0, 0, 0, x3, y3, 2, x4, y4, 2, x5, y5, 2, x6, y6, 2, x7, y7, 2, x8, y8, 2], "id" : 1001},
    {"keypoints" : [x9, y9, 2, x10, y10, 2 , 0, 0, 0, 0, 0, 0, 0, 0, 0, 0, 0, 0, 0, 0, 0, 0, 0, 0, 0, 0, 0], "id" : 1002}
]
```

```
params_kp_limb = {
    'limbs_point': [
        [0, 1],
        [2, 4],
        [2, 5],
        [3, 6],
        [3, 7],
        [4, 6],
        [5, 7],
        [6, 7],
    ], 'joint_indices': [
        0 ,
        1 ,
        2 ,
        3 ,
        4 ,
        5 ,
        6 ,
        7 ,
    ],

}
```

COMPUTER SYSTEM, DIMENSION MEASUREMENT METHOD, AND STORAGE MEDIUM

TECHNICAL FIELD

The present invention relates to a computer system, a dimension measurement method, and a storage medium for measuring dimensions from an image of a device processing result.

BACKGROUND ART

In recent years, in order to improve the performance of semiconductor devices, new materials have been introduced into semiconductor devices. At the same time, the structure of semiconductor devices has become three-dimensional and more complex. Further, the current state-of-the-art semiconductor device processing requires nanometer-level accuracies. Thus, a semiconductor processing apparatus is required to be able to extremely accurately process a variety of materials into various shapes, and is necessarily provided with a large number of control parameters (input parameters).

In an etching apparatus, which is a representative processing apparatus, there are more than 30 setting items for controlling a plasma discharge. When a discharge with these setting values fixed is one step, processing proceeds while switching steps having different setting values, one after another. In state-of-the-art processes, one processing step may normally involve 10 or more steps, sometimes as many as 30 or more steps. Thus, in order to optimize the combination of steps and all the setting values in a step, processing tests are carried out under hundreds of conditions. The number of engineers having know-how to draw apparatus performance and high apparatus operating skills is limited, and it is expected that in the future, derivation of conditions and operation of apparatus would increasingly not proceed according to plan.

Particularly, in order to allow a process for realizing a desired structure to be formulated in a short period, it is necessary to search a huge amount of existing experimental data for a similar structure, and to use it as a starting point for formulating a process. In this case, it is necessary to have dimensions measured from a scanning electron microscope (SEM) image. Currently, dimension measurement is often performed manually. However, for state-of-the-art process applications, the structure has become complex and the number of measurement points per image has also increased, so the manually performed dimension extraction is reaching its limit. Further, manual measurement may cause operator dependency in the measured value. Even in the case of an image in which unit patterns of lines/spaces are repeated, because the individual patterns are measured one by one, there is the problem that, other than process variations, human errors may also be added to the measured value statistics.

With regard to these problems, Patent Literature 1 discloses a measurement method and a measurement apparatus for accurately determining a side wall angle by determining a profile line from brightness values of an image, and using the coordinate values of the two points of upper and lower portions of a pattern cross section to manually remove the signals of white shade portions particular to an SEM image.

Patent Literature 2 discloses a measurement method and a measurement system in which edge points are determined from changes in brightness values of an SEM image, and a straight line approximating each side of a pattern is identified to extract the angle and length of each side, while reducing operator dependency.

Patent Literature 3 discloses a measurement method and a measurement system for measuring dimensions in which object detection and semantic segmentation, which are a kind of image recognition technology based on deep learning, are used, and region division and division of repetitive unit patterns are performed to detect a profile line on which measurement points required for measurement are present.

CITATION LIST

Patent Literature

Patent Literature 1: JP 2012-68138 A
Patent Literature 2: JP 2002-350127 A
Patent Literature 3: WO 2020/121564

SUMMARY OF INVENTION

Technical Problem

The measurement methods described in Patent Literatures 1 and 2 are based on edge detecting methods using a brightness value. The methods require operations such as parameter tuning for threshold values and designation of an interface position by visual determination for each image, and cannot be said to be approaches suitable for automatic measurement. In order to realize automatic measurement that does not require visual adjustment, it is necessary to extract an appropriate profile of an object by recognizing not a local brightness distribution but the regions of individual objects shown in an image. It is considered that image recognition providing performance equal to, or higher than, that of such visual operation can be realized by applying image recognition technology using machine learning, or deep learning in particular.

The approach of Patent Literature 3, while capable of realizing automatic measurement, has problems. For example, an object detection model for dissection into unit patterns is required, so that a total of two models need to be trained. Further, the measurement point coordinates required for measurement need to be determined by post-processing based on profile line data.

Under such circumstances, the present disclosure proposes techniques for further reducing the man-hours of the operator (user) during measurement, to realize high-speed dimension measurement (high-speed, including a preparation period for dimension measurement).

Solution to Problem

The present disclosure solves the problems by applying a human pose estimation (HPE) model, which is an image recognition technology, to pattern recognition for a semiconductor image. The HPE model is a machine learning model for estimating the pose of a person in an image, and has conventionally been used mainly for pedestrian movement recognition by self-driving vehicles, object processing for game devices and animation, and the like.

In a HPE model, the pose of a person is represented by connections of a plurality of line segments, called skeletons, having different lengths or inclinations, and the coordinates of the ends (nodes: keypoints) of each line segment are used to describe the skeletons. The techniques of the present disclosure are based on the viewpoint that, as long as the skeletons of the HPE model can be appropriately set in accordance with the pattern shape of the dimension measurement location of a semiconductor pattern: in other words, if the HPE model can be appropriately trained, the keypoints can be used as base points during pattern dimension measurement. Thus, the techniques of the present disclosure solve the problems of the conventional techniques by applying the HPE model to the dimension measurement for a semiconductor pattern.

In order to solve the problems, in one example, the present disclosure provides a computer system for providing a function for: extracting, from image data of a semiconductor pattern, coordinate information about a base point for measuring a dimension of a desired location of the semiconductor pattern: and measuring the dimension using the coordinate information of the base point. The computer system includes a training device in which a pose estimation model for outputting the coordinate information of at least two base points as a training result is implemented. The training device is trained in advance using teacher data having the image data of the semiconductor pattern as an input and the coordinate information of at least two base points as an output. The computer system, with respect to new image data input into the training device, extracts coordinate information of at least two base points and a dimension.

Advantageous Effects of Invention

When a machine learning model for performing dimension measurement is trained, it is not necessary to perform the two stages of steps of extracting a profile line and further extracting from the profile line base points for dimension measurement. Thus, the end-to-end learning time can be reduced. Further, because the measurement approach uses a machine learning model, automatic measurement can be realized. Other problems, configurations, and effects will become apparent from the description of the examples.

BRIEF DESCRIPTION OF DRAWINGS

FIG. 5 is an example of a description of measurement condition data.

FIG. 6 illustrates a structure example of annotation data.

FIG. 8 illustrates an example of skeleton structure data.

DESCRIPTION OF EMBODIMENTS

In the following, specific examples of dimension measurement of a semiconductor pattern using an HPE model will be described. As used herein, the HPE model may be simply referred to as a pose estimation model.

(A) Example 1

In the present example, a configuration example of a dimension measurement system in which an HPE model is implemented as a machine learning model will be described. In the dimension measurement system of the present example, teacher data for the machine learning model is created manually. As the teacher data, a cross-sectional SEM image that is image data of the object for dimension measurement, annotation data describing the coordinates of keypoints of the cross-sectional SEM image, and a skeleton definition file are used. In a preliminary learning step, a cross-sectional SEM image as input data and the aforementioned teacher data are fed to the HPE model to have the keypoint positions learned. Here, while a skeleton is not necessarily the same as a measurement location, the ends of a skeleton are always keypoints.

In an inference step, with respect to a given input image, keypoints are estimated by the trained HPE model. In a measuring step, the keypoint coordinates of both ends of each measurement location are determined from a group of estimated keypoint coordinates, and the dimension of a previously designated measurement location is automatically measured.

Figure 1:
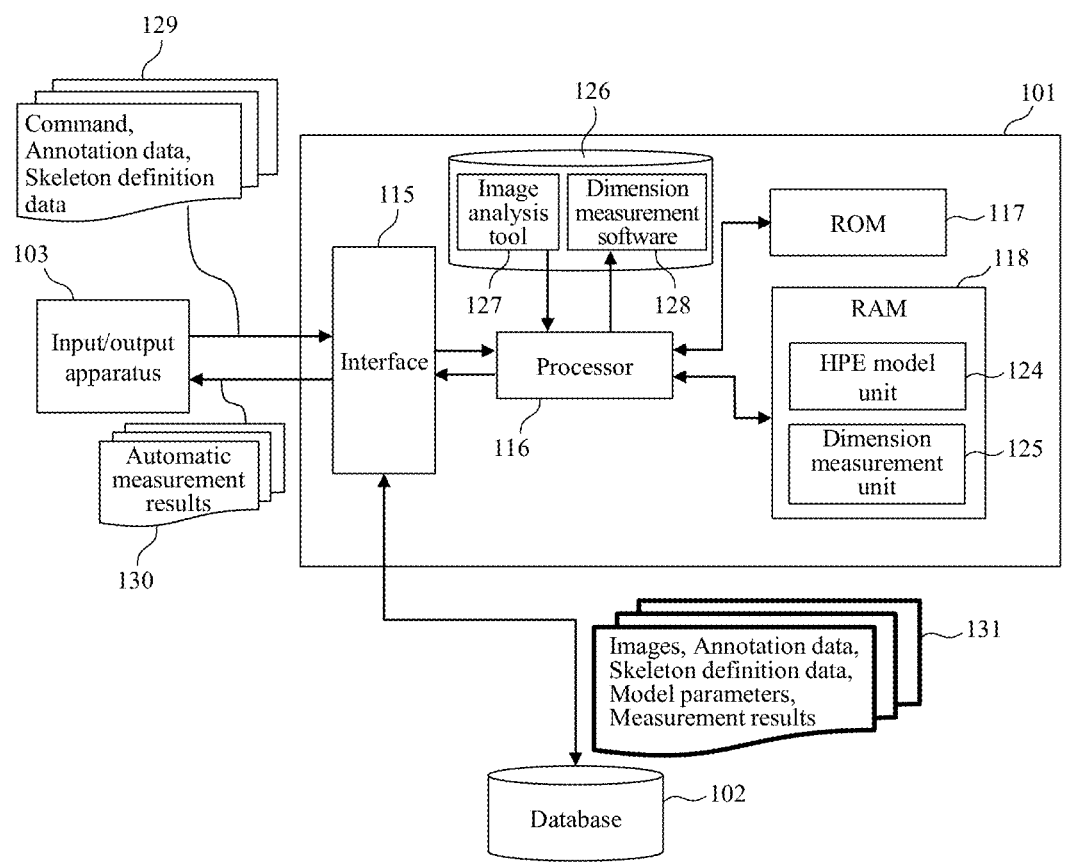
FIG. 1 illustrates an internal configuration example of a server used in a dimension measurement system of Example 1.

Internal Configuration Example of Server 101 in which Dimension Measurement Function is Implemented FIG. 1 illustrates an internal configuration example of a server 101 in which the dimension measurement function of the present example is implemented. In the housing of the server 101, an interface 115, a processor 116, a nonvolatile memory (ROM) 117, a volatile memory (RAM) 118, and a storage 126 are accommodated, for example. Inputting of image data and teacher data into the server 101 and outputting of a dimension measurement result are performed by an input/output apparatus 103 via the interface 115. Image data as input data, annotation data, skeleton definition data, model parameters representing a trained model, and measurement results are stored in a database 102, and are read out, as needed. While not illustrated, the input/output apparatus 103 is provided with input/output devices, such as a mouse for operating the GUI screen of the manual image analysis tool 127 and a keyboard for inputting various setting values.

The storage 126 stores the manual image analysis tool 127 and dimension measurement software 128 having the dimension measurement function of the present example. The dimension measurement software 128 is loaded into the RAM 118, as needed. The processor 116 executes the software to realize the dimension measurement function of the present example. The manual image analysis tool 127 is a tool for outputting measurement condition data necessary for creating annotation data constituting the teacher data, and is provided with functions for calculating the coordinates of a specific location of an image by pixel computation processing, and for calculating the distance between coordinates. In the present example, a commercially available tool is used as the manual image analysis tool 127.

The dimension measurement software 128 of the present example is composed mainly of an HPE model unit 124 and a dimension measurement unit 125, both of which are incorporated into the dimension measurement software 128 in the form of software modules. FIG. 1 illustrates a state in which the HPE model unit 124 and the dimension measurement unit 125 are loaded into the RAM 118.

Example of HPE Model

Figure 2:
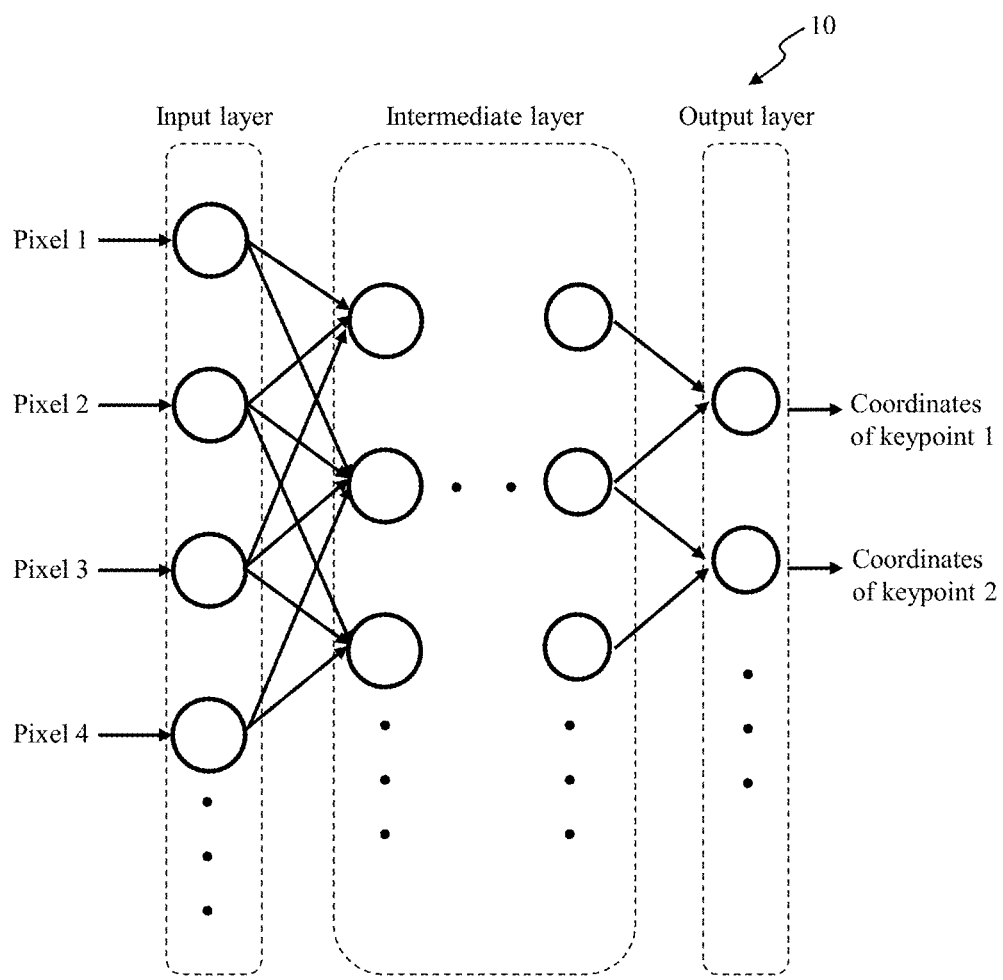
FIG. 2 is a schematic diagram illustrating a configuration example of a machine learning model of Example 1.

FIG. 2 illustrates an example of the HPE model used in the server 101. The HPE model of FIG. 2 has a neural network structure in which pixel information input to an input layer is propagated to an intermediate layer and an output layer successively and computed, whereby the coordinates of the keypoints are output from the output layer. The intermediate layer has a structure in which a large number of layers of convolutional layers, pooling layers and the like are repeated. While such is the basic structure of the HPE model of the present example, the even more specific layer structure may differ depending on the details of the model that is adopted.

When the HPE model is trained, the parameters of the intermediate layer are adjusted so that an error between the coordinates of a keypoint that is output and the correct annotation data is minimized. The HPE model illustrated in FIG. 2 is implemented in the HPE model unit 124 of FIG. 1, and the body of the dimension measurement software 128 itself is stored in the storage 126 of FIG. 1. The HPE model of FIG. 2 during training or inference is loaded into the RAM 118 and is executed by the processor 116.

While in the following description the term training device refers to the HPE model unit 124 incorporated into the dimension measurement software 128 as a software module, modes of implementation other than a software module may also be applicable. Further, while in the present example the HPE model is configured using the neural network 10, this is not a limitation, and it is also possible to use machine learning models, such as the pictorial structure model.

<Training Process for HPE Model>

Figure 3:
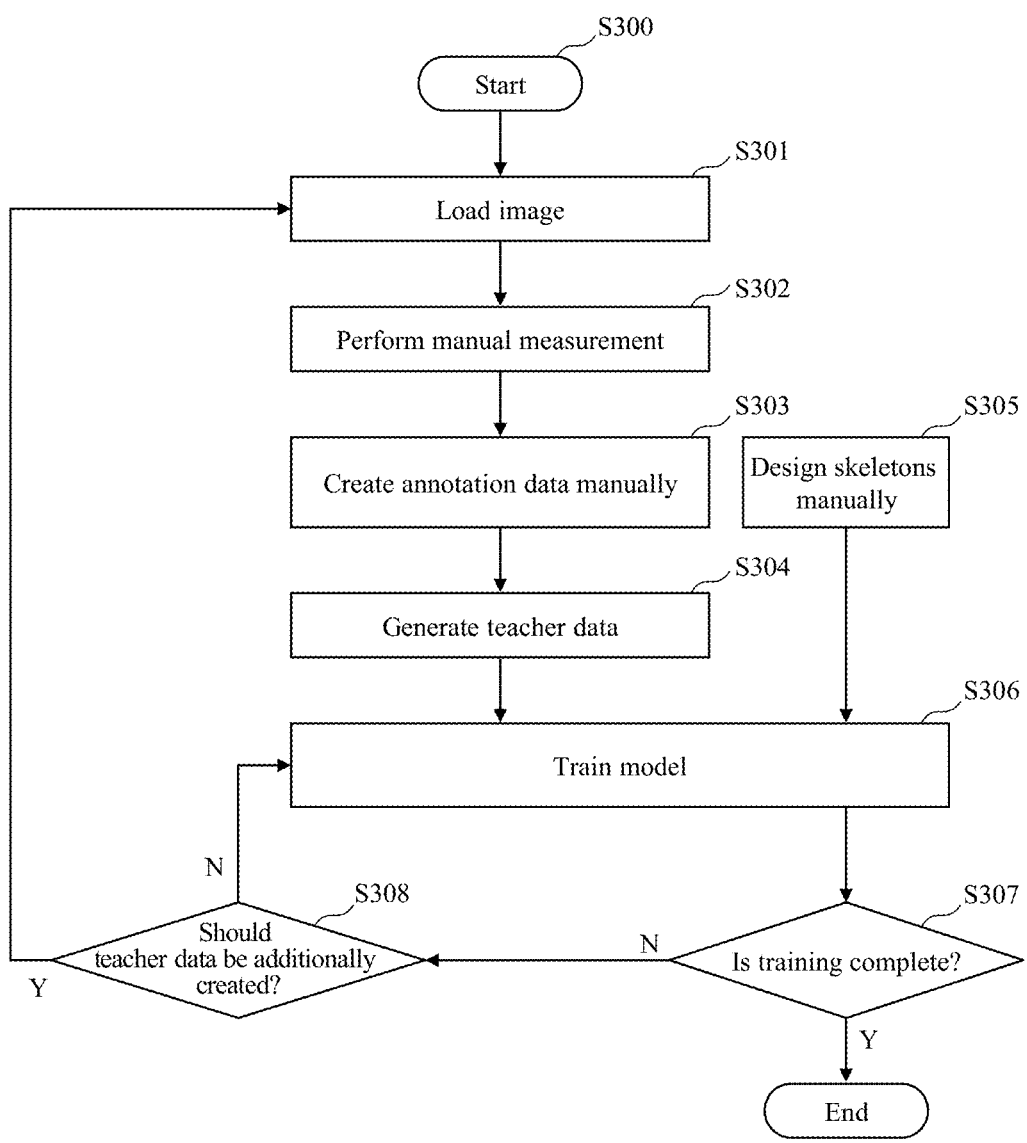
FIG. 3 is a flowchart illustrating a training process for the machine learning model according to Example 1.
Figure 4:
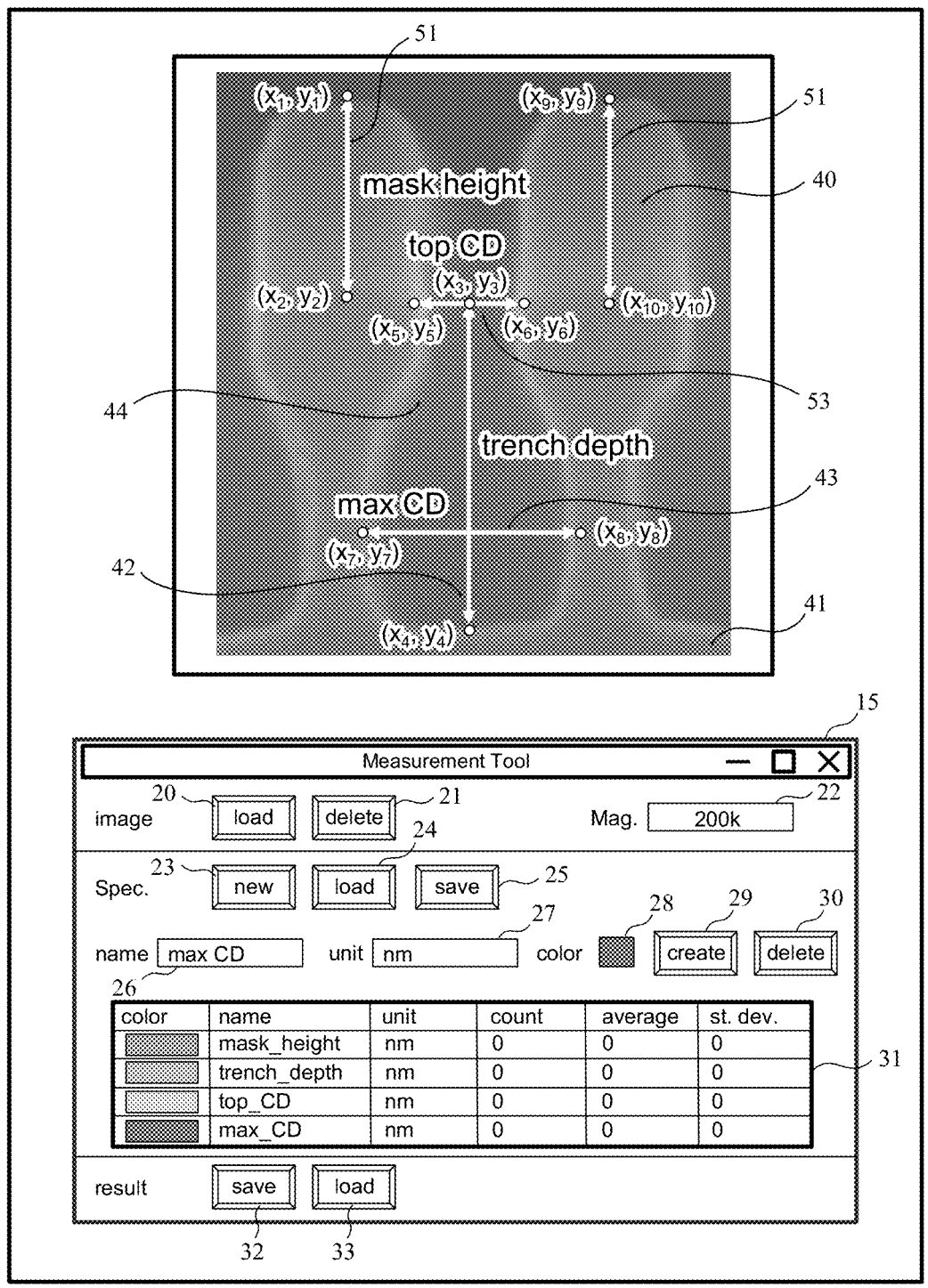
FIG. 4 is a schematic diagram illustrating a graphical user interface (GUI) screen of an image analysis tool used in manual measurement implemented in the initial process of training.

Next, with reference to FIG. 3 to FIG. 7, a procedure for creating teacher data manually and training the HPE model will be described. FIG. 3 is a flowchart for describing a process performed by the server 101 in Example 1 to train the model from an input image. FIG. 4 illustrates a GUI screen of the manual image analysis tool 127, which is displayed on a display provided in the input/output apparatus 103 of FIG. 1.

When a load button 20 in the upper portion of FIG. 4 is pressed, a plurality of images read from the storage 126 are displayed in thumbnail on the GUI. From the images, the system operator selects an image desired to be adopted as teacher data. An image delete button 21 is used when a selected image is desired to be cancelled. A magnification cell 22 is used for inputting a magnification when capturing an image. The value is used when converting a dimension from a pixel unit to an actual dimension.

The image selected by the operator in FIG. 4 is a cross-sectional SEM image of a semiconductor. The subject structure of the cross-sectional SEM image comprises a structure obtained by forming a mask portion 40 of silicon oxide on a silicon substrate portion 41, followed by formation of a trench pattern.

(i) Step S301

The HPE model unit 124 (which may use the processor 116 as the actor) senses the selection of an image by the operator, and loads the selected image (step S301).

(ii) Step S302

The operator sets a measurement location on the GUI screen of the manual image analysis tool 127 and performs measurement, and the HPE model unit 124 receives a measured value obtained by the operator (step S302). The measurement locations intended in the present example are one location only of a mask height 51 with respect to the mask portion 40, and the three locations of a trench depth 52, a top critical dimension (CD) 53, and a maximum CD 54 with respect to a trench portion 44. The objects are the two of the mask portion 40 and the trench portion 44.

Herein, the various buttons shown in the middle of FIG. 4 will be described. The buttons in the middle of FIG. 4 are used when creating characteristic data of the measurement locations. The characteristic data is the data describing correspondences between the name, unit, and color of the measurement locations. With a newly create button 23, new characteristic data is created. With a load button 24, created characteristic data is loaded. With a save button 25, characteristic data that has been created is saved. When characteristic data is newly created, first the name of the measurement location is input in the name cell 26, and then the unit of dimension is input in the unit cell 27. In a color cell 28, a color not being used is automatically set. As a generate button 29 is pressed, a selected row is registered in a measured value list 31, or a new row is added to the measured value list 31. When specific data of the characteristic data is desired to be deleted, a corresponding row in the measured value list 31 is selected, and then a measurement location delete button 30 is pressed. In the measured value list 31, color, name, unit, count, average value, and standard deviation are displayed, for example.

After the desired image is displayed in step S301 of FIG. 3, the operator operates the various buttons shown in the middle of FIG. 4 and the mouse of the input/output apparatus 103 to measure the length of the trench depth 42 and the maximum CD 43 appearing in the image. When first the newly create button 23 is pressed, the name cell 26 and the unit cell 27 are activated and enabled for receiving an input, and then the name of a measurement location and the unit of dimension are input.

Then, the mouse is operated to move the cursor or a pointer to a desired start point and end point of the displayed image, and the mouse is clicked at the two locations. The processor 116 detects the first mouse click event, determines that the coordinates of the clicked location are of the start point in units of pixels, and records the coordinates in RAM 118. Similarly, the processor 116, upon detecting the second mouse click event, determines that the coordinates of the clicked location are of the end point, and records the coordinates in RAM 118. The processor 116 computes the dimension between the start point and the end point from the distance between the two coordinates, and displays the dimension in the measured value list 31. After the display, the operator presses the generate button 29, whereby the computed dimension value or the values of count, average value, and standard deviation in the measured value list 31 are registered in the measured value list 31. Each time the start point and the end point are newly added, the values of count, average value, and standard deviation in the measured value list 31 are updated.

Figure 7:
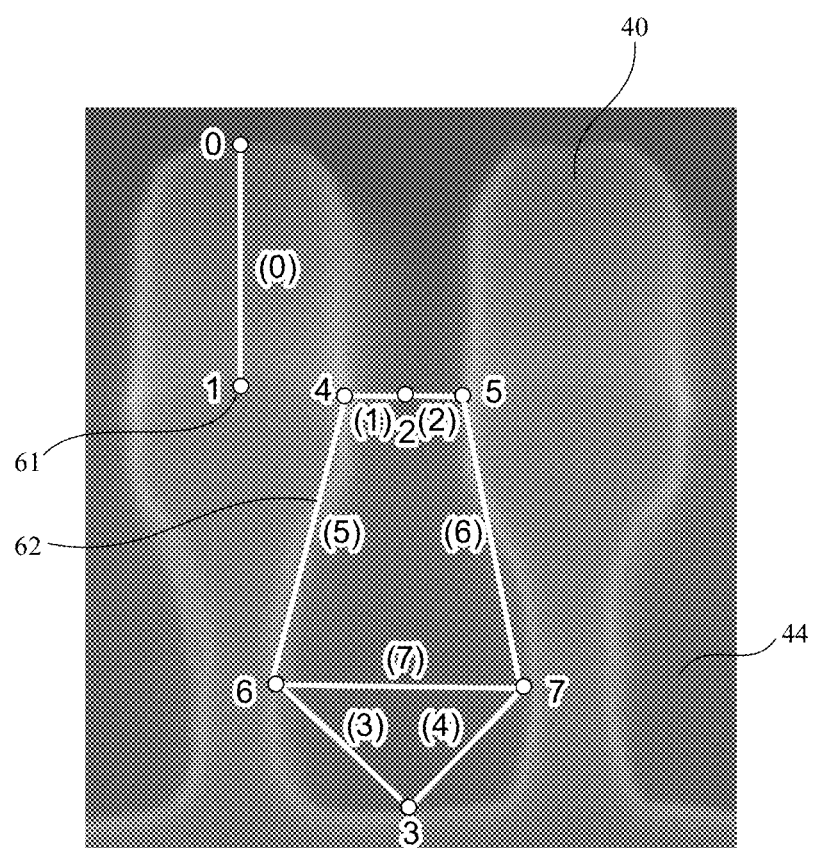
FIG. 7 illustrates an example of a skeleton structure set for a semiconductor pattern to be measured in Example 1.

When a new image is measured, the measured value list 31 is vacant. When a registered image is measured, the name of a desired measurement location may be selected from the measured value list 31 by means of the mouse, and then the start point and end point of the measurement location may be clicked on the image. FIG. 7 shows an image obtained after measuring the mask height at two locations, the trench depth at one location, the top CD at one location, and the maximum CD at one location, where the start point and end point of each measurement location are displayed by dot pointers, together with the coordinate values of the start point and the end point. Also, the line segments connecting the start point and the end point corresponding to each of the mask height 51, the trench depth 42, the top CD 53, and the maximum CD 43 are displayed. When ending the measurement, the save button 32 at the bottom is pressed. Measurement condition data of a CSV file and a text file corresponding to the measured value list are output. When a previously saved measurement result is called, the load button 33 is pressed. Herein, the measurement condition data comprise data in which the name of a measurement location is associated with the coordinate values of the start point and end point of the measurement location.

FIG. 5 illustrates an example of the measurement condition data output from the manual image analysis tool 127 of the present example with respect to the image of FIG. 4, corresponding to the manual measurement performed by the operator in step S302. In this example, a form based on JSON format is adopted. In this file, measurement names L1, L2, for example, are names automatically allocated to distinguish the measurement locations, and are not used in the annotation data. In the position list that follows, the coordinate values of start point and end point are listed. If the image analysis tool does not have the measurement condition output function, an add-in incorporated into the tool needs to have an output function for a file describing at least the name of the measurement location, and the coordinates of the start point and end point of the measurement location. Thus, step S302 ends.

(iii) Step S303

When the manual measurement by the operator ends, the operator in step S303, on the basis of the measurement condition data that has been output, manually creates the annotation data illustrated in FIG. 6 and inputs (transmits) the data into the server 101. The present example contemplates a form based on JSON format, which is adopted in general data sets for human pose estimation. In this form, the x-coordinate, y-coordinate, and visibility degree are listed for each object in the numerical order of the keypoints of the skeletons. The keypoint number needs to be determined uniquely. Because it is contemplated that the measurement location may be set in various ways, herein a rule is used by which the measurement location in the vertical direction is first and then the measurement location in the lateral direction is later, and the start point is disposed first and the end point later. In the example of FIG. 4, the order of the measurement locations is the mask height, the trench depth, the top CD, and the maximum CD. The visibility degree is 2 if the keypoint is completely visible, and 0 if not visible at all. The id is the sequential number distinguishing the objects, and is manually given in accordance with the number of images and the number of objects included therein. In the present example, there are the two of the mask portion 40 and the trench portion 44, the mask portion 40 having one measurement location and the trench portion 44 having three locations. However, the pose estimation model is not able to handle multiple types of objects. Accordingly, the mask portion and the trench portion are not distinguished, and the mask and the trench are considered a single object having eight keypoints. With respect to the mask portion 40, the measurement location by itself constitutes a skeleton. A JSON format file describing the above information with respect to all images alongside the image file names provides annotation data.

(iv) Step S304

The HPE model unit 124 configures teacher data from the annotation data acquired in step S303 and the image data. Specifically, the annotation data and the image data are combined into a set to generate teacher data.

(v) Step S305

After, or in parallel with, the creation of the teacher data, the operator manually makes and inputs (transmits) a skeleton design to the server, and then the HPE model unit 124 acquires it. FIG. 7 illustrates an example of a skeleton structure designed on the basis of the measurement locations of FIG. 4. Skeleton definition data is indispensable for a pose estimation model: without the data, the HPE model does not run. Keypoints 61, which are the base points for dimension measurement, are at eight locations per unit pattern comprising a mask portion and a trench portion, and eight corresponding skeletons 62 are set. The keypoints and the skeletons are given serial numbers 0 to 7 and (0) to (7), respectively. In the present example, there are three measurement locations in the trench portion 44. Because a location where skeletons intersect requires an excess keypoint which is not a base point of a measurement location, the trench depth and the maximum CD cannot be both adopted as skeletons as is. While skeleton design involves freedom, if there are design rules based on a pattern, skeletons matching the pattern can be quickly determined.

In the example of FIG. 7, the skeletons are designed using the rules (1) no new keypoint is added other than the keypoints set as the measurement locations; (2) a closed polygon is made by connecting the outline keypoints: and (3) an internal skeleton is also made so that a polygon greater than a rectangle is not formed. While keypoint detection accuracy may be improved by adopting more complex skeletons, this results in an increase in training time and required memory. The operator corrects the design rules as needed or by trial and error.

FIG. 8 illustrates an example of definition data describing the skeletons designed in FIG. 7, where dictionary format is adopted. The eight sets of numbers corresponding to the key limbs_point are the keypoint numbers of the start point and end point of the skeletons arranged in the order of the skeleton numbers, and the eight numbers corresponding to the key joint_indices are the keypoint numbers. During the training of the HPE model, in addition to training data comprising an image and annotation data, the skeleton definition data illustrated in FIG. 7 is also input into the HPE model unit 124 to perform training.

(vi) Step S306

Figure 9:
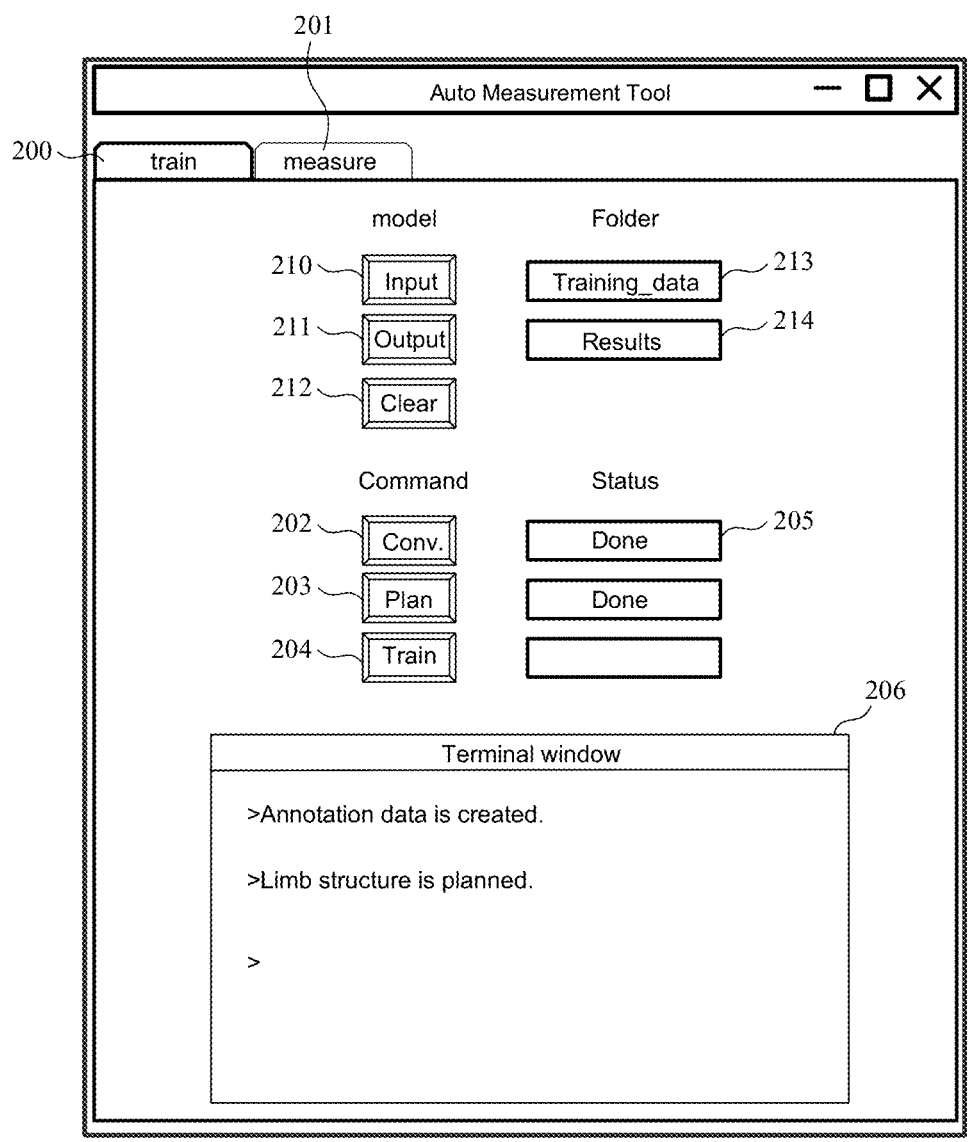
FIG. 9 illustrates a configuration example of a GUI screen displayed on a terminal PC when training of a model is performed.

FIG. 9 illustrates one example of a GUI screen for performing necessary operations during training of the HPE model in the present example, the GUI screen being displayed on the input/output apparatus 103. The GUI screen illustrated in FIG. 9 is configured such that a training screen that is used during training and a measurement screen that is used when performing measurement can be switched using tabs. The illustrated screen is displayed when a train tab 200 denoting "train" is selected. In the upper portion, a group of buttons for instructing execution of a module and model training is disposed. In the bottom, a terminal output screen (terminal window) 206 is disposed.

First, in order to designate a folder in which training data is stored, an input button (training data storing folder designating button) 210 is pressed to designate the folder. The designated folder name is displayed in a folder name cell 213. Then, in order to designate a folder for storing a trained model after training, an output button 211 is pressed to designate the folder. The designated folder name is displayed in a folder name cell 214. When changing the designated folder name, a clear button 212 is pressed. When starting model training, a training start button 204 is pressed. Besides the training start button 204, a status cell 205 indicating status is displayed. When "Done" is displayed in the status cell 205, the training step of step S306 is complete. The meanings of a conversion module execution button 202 and an automatic skeleton designing module execution button 203 displayed in FIG. 9 will be described with reference to Example 2 or 3. These buttons, however, do not function even if pressed because functional blocks for realizing the processes of the buttons are not incorporated in the dimension measurement software 128 in the dimension measurement system of the present example.

(vii) Step S307

The HPE model unit 124, once the training is over to some extent (usually, the input of tens to hundreds of images), performs a confirming operation as to whether the training has been completed (step S307). The HPE model unit 124, during the confirming operation, estimates a dimension using the image (input by the operator) of a pattern with a known dimension, and determines whether the training has been completed depending on whether the correct response rate exceeds a predetermined threshold value, for example. If the correct response rate is lower than the threshold value (No in S307), the process proceeds to step S308. On the other hand, if the correct response rate is greater than or equal to the threshold value (Yes in S307), the training process for the HPE model ends.

(viii) Step S308

The HPE model unit 124 determines whether additional creation of teacher data is necessary: in other words, whether unused teacher data is stocked in the storage 126 (step S308). If there is a stock of teacher data (and if the stock teacher data is suitable for training), the process returns to step S306 to perform re-training of the HPE model. If there is no stock of teacher data, it is determined that teacher data needs to be newly created, and the process returns to step S301 to perform the process of FIG. 3 again. If the correct response rate exceeds the threshold value, it is determined that the training is complete, and the operator ends the process of FIG. 3.

In the foregoing description, once a satisfactory trained model is obtained, the trained model is not updated. However, when the device structure of interest has been changed greatly, or when a measurement location is changed or added, it is necessary to repeat the training step of FIG. 3 and create teacher data once again. Further, if training has once been performed but the accuracy of the model is lacking, it is necessary to perform training again by increasing the number of teacher data items. For example, if the process conditions change little by little during development and the processed shape also changes, the accuracy of the model trained in the initial period may be decreased. In this case, it may be operationally effective to put aside an image regularly for model accuracy evaluation, and to evaluate the accuracy of the model by comparing the image with the result obtained by the measurement by the manual image analysis tool 127.

<Automatic Dimension Measurement Process Using Learning Model>

Next, with reference to FIG. 10 and FIG. 11, a dimension measurement method will be described in which a new image is input into the trained model. In the following, the object to be measured is a semiconductor film stack having the trench pattern of FIG. 4 formed therein, and a cross-sectional SEM image that is yet to be measured is already stored in a folder in the storage 126. Dimension measurement with respect to the new image is performed by the server 101. In the HPE model for which training has been completed, parameters configuring the respective layers of the neural network 10 illustrated in FIG. 2 are optimized, and the optimized parameters are stored in the storage 126 in the server 101. When inference is performed, the parameters are loaded into the RAM 118 and referenced by the processor 116, whereby the keypoint coordinates as the base points for measurement and dimension values are calculated.

Figure 10:
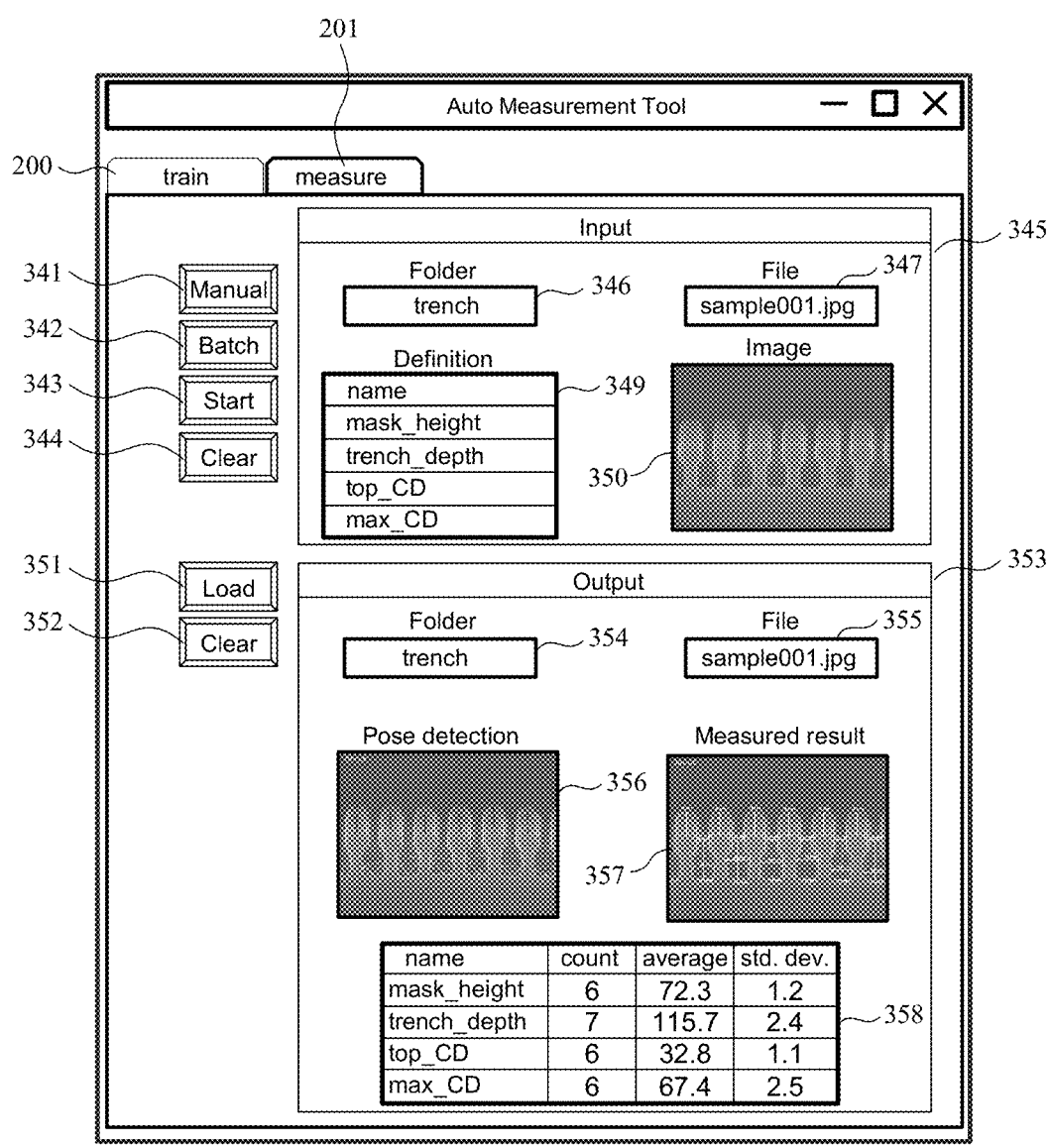
FIG. 10 illustrates a configuration example of a GUI screen displayed on a terminal PC when dimension measurement for a new image is performed using the trained model.

FIG. 10 is an example of a GUI screen of an automatic measurement tool displayed on the input/output apparatus 103 of FIG. 1 when automatic measurement is performed after completion of model training. The GUI screen of FIG. 10 is composed of an input panel 345 on the upper-right side of the screen, an output panel 353 on the lower-right side of the screen, and various operation buttons (buttons 341, 342, 343, 344, 351, 352) arranged on the left side of the screen. In the input panel 345, the selected image and folder information are displayed. In the output panel 353, measurement results are displayed. As in FIG. 9, the GUI screen is configured such that a training screen that is used during training and a measurement screen that is used when performing measurement can be switched using tabs. The screen of FIG. 10 is displayed when a measure tab 201 denoting "measure" is selected.

Among the various operation buttons, a manual button 341 is used when selecting, one by one, images desired to be measured. A batch button 342 is used to designate a folder when all images in the folder are measured all at once. When a measurement start button 343 is pressed, measurement starts, and a measurement result is automatically saved at the end. When redoing image selection, a clear button 344 is pressed to delete the information being displayed in the input panel 345. When a measurement result load button 351 is pressed, the measurement result is loaded and displayed. When a measurement result display clear button 352 is pressed, the display is deleted.

In the input panel 345, a folder name storing an image of interest is displayed in a folder name cell 346. In a file name cell 347, when the manual button 341 is pressed, the name of a designated image is displayed, and when the batch button 342 is pressed, the first image name is displayed. When changing the designated folder name or file name, the clear button 344 is pressed to make deletion and then designation is redone. In a definition window (measurement location definition list) 349, definition information about the measurement locations given to the image stored in the folder is displayed. In an input image panel 350, when the manual button 341 is pressed, the designated image name is displayed, and when the batch button 342 is pressed, the first image name is displayed.

In the output panel 353, the folder name storing the image of interest is displayed in a folder name cell 354. In a file name cell 355, when the manual button 341 is pressed, the designated image name is displayed, and when the batch button 342 has been pressed, the first image name is displayed. In a pose detection screen (pose estimation result display panel) 356, the detected skeleton structure is displayed on the input image. In a dimension measurement result display panel (measurement screen) 357, the measured dimension values are displayed on the input screen. In the pose detection screen 356 and the measurement screen 357, when the batch button 342 has been pressed, the results with respect to the first image are displayed. In a dimension measurement result cell 358, the count, average value, and standard deviation with respect to each measurement location are displayed. When the manual button 341 has been pressed, the results with respect to the designated image are displayed, and when the batch button 342 has been pressed, the first result is displayed.

Figure 11:
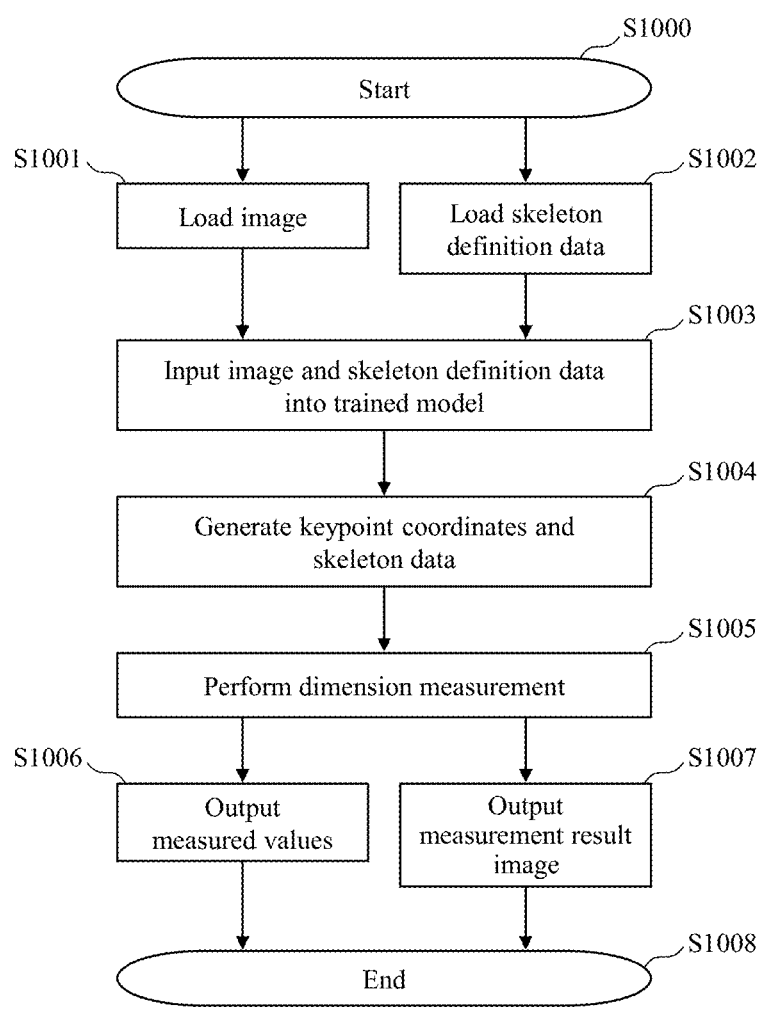
FIG. 11 is a flowchart illustrating a process for inputting an image to the trained model and outputting a dimension value.

FIG. 11 illustrates a flowchart of a process in which a new image is input into the trained model to perform dimension measurement. As the system operator presses the start button 343 of FIG. 10, the processor 116 starts execution of the process of the flowchart of FIG. 11.

(i) Step S1001 to step S1003

The dimension measurement unit 125 loads the image provided by the operator for dimension measurement (step S1001), and inputs the image and the skeleton definition data (step S1002) that has been created during training into the trained model (step S1003). The image (provided by the operator) that the dimension measurement unit 125 acquires is a single image when the manual button 341 of FIG. 10 is pressed. When the batch button 342 is pressed, image files stored in the folder of the name displayed in the folder name cell 346 of FIG. 10 are acquired (a plurality of images are input all at once).

(ii) Step S1004

After the image is input into the dimension measurement unit 125, the trained model outputs inference results including keypoint coordinates and a skeleton structure (step S1004).

(iii) Step S1005 and S1006

The dimension measurement unit 125 computes the dimension of each measurement location on the basis of the keypoint coordinates (step S1005).

(iv) Step S1006

The dimension measurement unit 125 displays the measurement results including statistical data on the GUI screen of the input/output apparatus 103, and further outputs the results in a predetermined file format (step S1006).

(v) Step S1007

The dimension measurement unit 125 overlaps the skeleton structure and measured values on the input image, and outputs the image data displayed in overlapped manner (step S1007). The measurement result file and image data that have been output are stored in a predetermined folder in the storage 126. In the example GUI screen of FIG. 9, the file and image data are stored in a folder named "trench".

Example of Overlapped Display of Image Data

Figure 12:
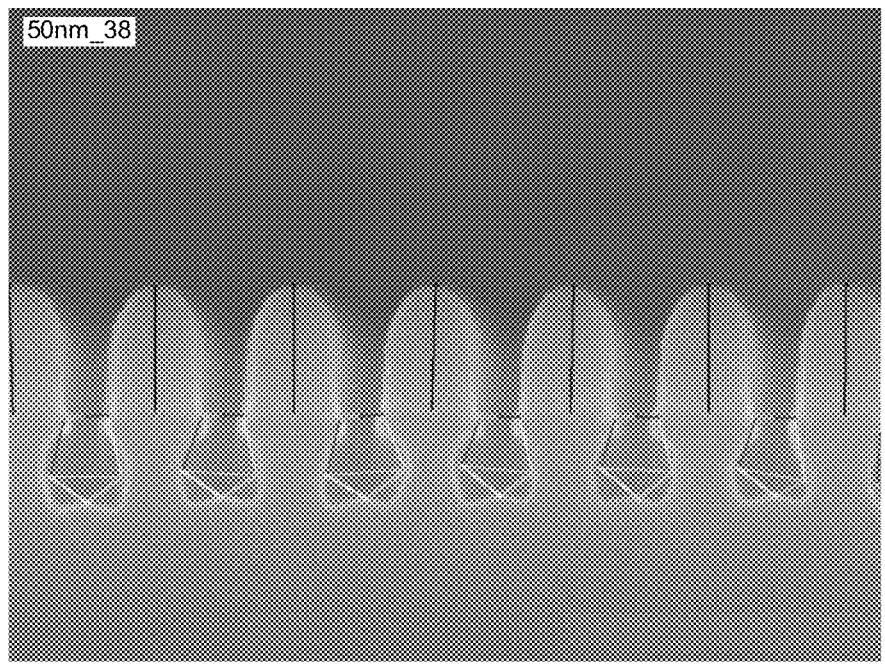
FIG. 12 is a figure for explaining a result obtained by newly inputting image data to the trained model.
Figure 13:
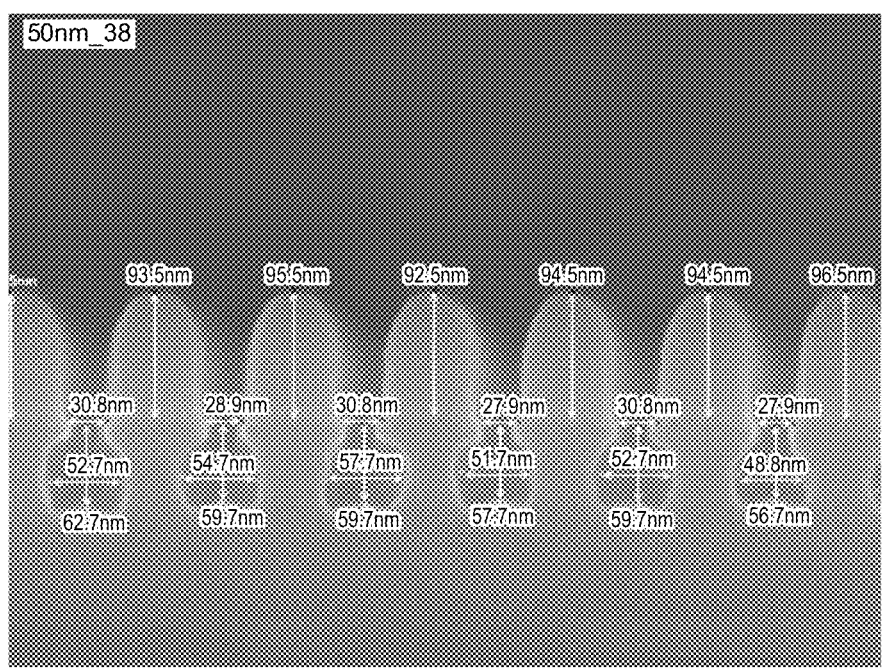
FIG. 13 is a figure for explaining a result obtained by newly inputting image data to the trained model.

FIG. 12 illustrates an example of image data in which the skeletons estimated by the trained model are displayed overlapped on the input image. FIG. 13 illustrates an example of image data in which the measured values are displayed overlapped on the same input image of FIG. 11.

Thus, according to the dimension measurement system or the dimension measurement method of the present example, it is possible to acquire the coordinate information of keypoints directly from the image being measured, and to realize a machine learning model that is more likely to be able to decrease training time than conventional techniques.

In the present example, a configuration example has been described in which an HPE model is applied to semiconductor pattern measurement using a cross-sectional SEM image. However, the techniques of the present disclosure are also applicable to a plan-view SEM image or a plan-view TEM image, a cross-sectional TEM image, a focused ion beam (FIB) image of a plane, and an FIB image of a cross section. However, a cross-sectional SEM image or a cross-sectional TEM image and an FIB image of a cross section involve measurement difficulties not found with a plan-view SEM or TEM and FIB images, such as 1) brightness varies for each image: 2) a structure in the back which is not required for dimension measurement is captured: and 3) the boundary of the interface of different materials for dimension measurement is unclear. Accordingly, the effects of application of the techniques described in the present example may be considered to be greater for a cross-sectional SEM image, a cross-sectional TEM image, or an FIB image of a cross section.

(B) Example 2

In Example 1, the configuration example of the dimension measurement system has been described in which teacher data and skeleton definition data are manually created to train the HPE model. In this configuration example, the man-hours for creating the teacher data, particularly the man-hours for creating the annotation data, always imposes a large burden. In the case of dimension measurement using the HPE model, the coordinates of the keypoints at both ends of a measurement location are required as the annotation data. Accordingly, in the present example, a configuration example of the dimension measurement system will be described in which a conversion module for creating the annotation data from the output data of the image analysis tool of Example 1 is implemented. Many parts of the configuration of the dimension measurement system of the present example are common to those of the configuration of Example 1. Thus, in the following description, description of the portions common to Example 1 is omitted.

Internal Configuration Example of Server

Figure 14:
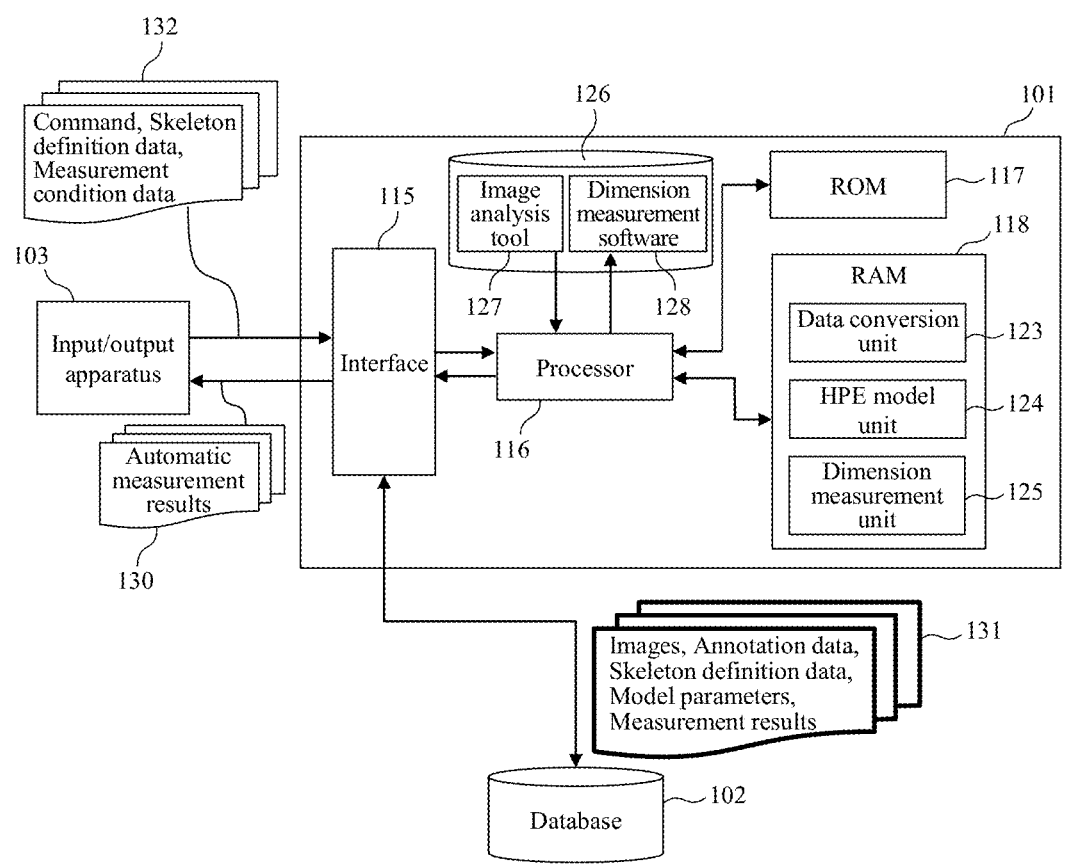
FIG. 14 illustrates an internal configuration example of a server used in a dimension measurement system of Example 2.

FIG. 14 illustrates an internal configuration example of a server 101 in which the dimension measurement function of the present example is implemented. The dimension measurement software 128 of the present example stored in the storage 126 is provided with a data conversion unit 123. As in the HPE model unit 124 described in Example 1, the data conversion unit 123 is incorporated in the dimension measurement software 128 in the form of a software module, and constitutes a part of the functional block of the dimension measurement software 128. When the dimension measurement software 128 is executed, the functional blocks of the data conversion unit 123, the HPE model unit 124, and the dimension measurement unit 125 are loaded into RAM 118 and executed by the processor 116. Image data that is input data, skeleton definition data, automatically created annotation data, model parameters representing the trained model, and measurement results are stored in the database 102 and called, as needed. Other configurations, operations, and functions are similar to those of FIG. 1. Accordingly, descriptions other than those made above are omitted.

<Training Process for HPE Model>

Figure 15:
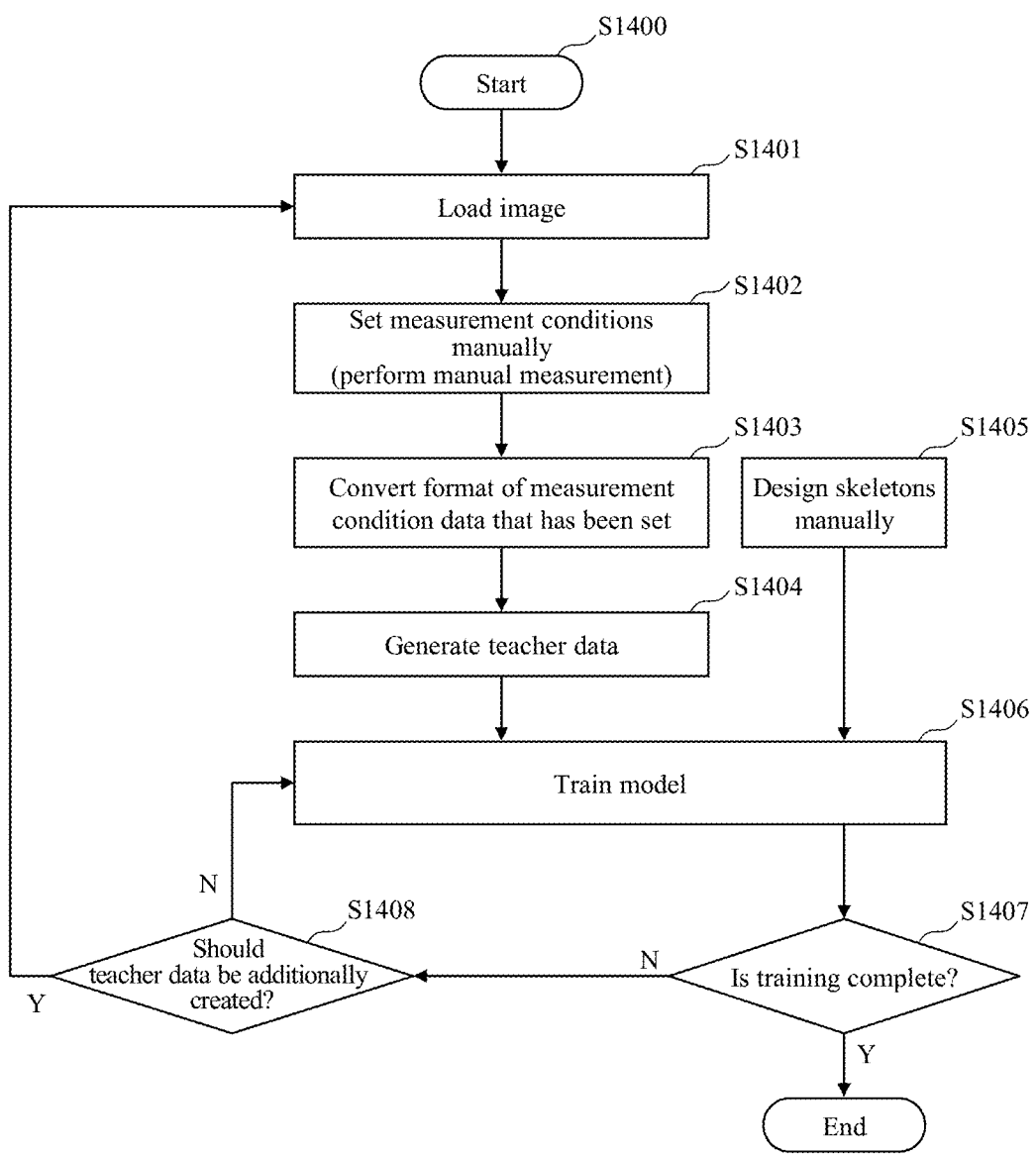
FIG. 15 is a flow chart illustrating a training process for a machine learning model of Example 2.

FIG. 15 illustrates a flowchart for describing the steps performed in Example 2 by the server 101 to train the HPE model from the input image. The object to be measured is a trench pattern similar to that of Example 1. The GUI screen for the system operator to perform manual measurement for creating teacher data is also similar to that of Example 1 (similar to FIG. 4).

(i) Step S1401

First, the operator presses the load button 20 of FIG. 4 and selects an image to be adopted as teacher data. Then, the HPE model unit 124 loads the selected image.

(ii) Step S1402

Next, the operator performs designation of the measurement location and manual measurement, in the same way as in Example 1. Then, the HPE model unit 124 acquires a measured value list and measurement condition data input by the operator. The measurement condition data is data in which the name of the measurement location, and the coordinates of the start point and end point of the measurement location are described. If an existing image analysis tool has the function for outputting measurement conditions, that function may be used: if not, an add-on for outputting measurement conditions is created and incorporated.

The operator performs manual measurement until data is accumulated to such an extent that training of the HPE model is possible (usually, on the order of tens to hundreds of images), to increase the amount of data included in the measurement condition data. When an amount of data enabling training has been accumulated, the process proceeds to step S1403.

(iii) Step S1403

The HPE model unit 124 performs a format conversion process, and creates annotation data by means of the conversion module using the measurement condition data.

When the measurement condition data is converted into the annotation data, the operator presses the conversion module execution button 202. Then, the operator, when automatically designing skeletons from the measurement condition data, presses the automatic skeleton designing module execution button 203. However, in the dimension measurement system of the present example, an automatic design module for skeletons is not incorporated in the dimension measurement software 128. Thus, pressing of the automatic skeleton designing module execution button 203 does not cause an operation. When starting training of the model, the training start button 204 is pressed. Besides each of the buttons, the status cell 205 indicating status is displayed. When the operator presses the conversion module execution button 202 with respect to the selected measurement condition data and "Done" is displayed in the status cell 205, the format conversion process of step S1403 is complete. When the annotation data is created, preparation of the teacher data comprising an image and annotation data is complete.

(iv) Step S1404

The HPE model unit 124, using the annotation data and the image, generates teacher data for use in training of the HPE model. The operations necessary during training of the HPE model are performed via the GUI screen illustrated in FIG. 9, as in Example 1. The GUI screen is also displayed in the input/output apparatus 103.

The structure of the annotation data obtained by performing the format conversion process on the measurement condition data illustrated in FIG. 5 is similar to that of the annotation data described with reference to FIG. 6. However, in contrast to Example 1, id is automatically given by the data conversion unit 123.

(v) Step S1405

The operator performs manual designing of the skeletons in the same way as in Example 1. The HPE model unit 124 receives the skeleton data and creates skeleton definition data.

(vi) Step S1406

The HPE model unit 124 inputs the teacher data and the skeleton definition data into the HPE model to train the model.

(vii) Step S1407

The HPE model unit 124, when the training process of step S1406 is finished to some extent, receives the result of the confirming operation, by the operator, as to whether training has been completed in the same way as in Example 1. If it is determined that training is completed (Yes in S1407), the training process for the HPE model ends. On the other hand, if it is determined that training is not complete (No in S1407), the process proceeds to step S1408.

(viii) Step S1408

The HPE model unit 124 determines whether additional creation of teacher data is necessary. If there is a stock of teacher data (and if the teacher data is suitable for training), the process proceeds to step S1406, where the teacher data is used to perform re-training of the HPE model. If there is no stock of teacher data, it is determined that teacher data needs to be newly created, and the process returns to step S1401. The HPE model unit 124 performs the flow of FIG. 15 again.

This completes the description of the training process for the HPE model of the present example. The method for using the model for which training has been completed is the same as for Example 1, and therefore the relevant description is omitted.

With the dimension measurement system, the dimension measurement method, or the dimension measurement software of the present example, it is possible to create the annotation data mechanically from the results of the manual measurement performed in the initial stage of a series of measuring steps. Thus, the extra man-hours for creating the manual annotation data can be omitted. Accordingly, compared to the dimension measurement system, the dimension measurement method, or the dimension measurement software described in Example 1, it is possible to realize a system or measurement method that puts less burden on the system user during the training process.

(C) Example 3

In Example 2, the configuration example of the dimension measurement system provided with the conversion module for automatically generating annotation data from the results of manual measurement has been described. In the present example, a configuration example of the dimension measurement system additionally provided with an automatic skeleton designing function will be described.

Generally, when training an HPE model, it is necessary to define the skeleton structure of the person. In the case of a person, a need to change the skeleton structure hardly arises. However, in the case of a cross-sectional image of a semiconductor device, the shape of the object to be measured varies depending on the device structure as a target, and further the measurement location may be changed in the course of development. Re-designing of the skeleton structure each time the measurement location is changed is difficult at the process development site. Thus, it is desirable that an automatic skeleton designing module is implemented in a dimension measurement system used at the process development site.

In the following, the details of the present example are described with reference to the drawings. As in Example 2, the configuration of the dimension measurement system of the present example has many parts common to Examples 1 and 2. Thus, in the following description, description of the locations common to Examples 1 and 2 is omitted.

Configuration Example of Dimension Measurement System

Figure 16:
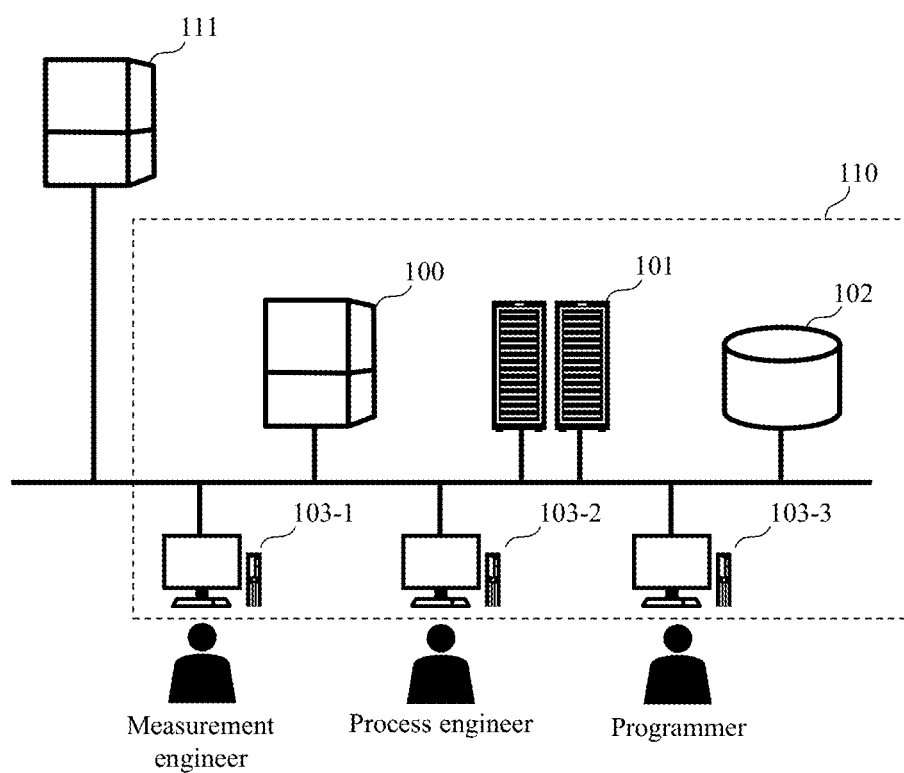
FIG. 16 is a schematic diagram illustrating a network environment in which a dimension measurement system of Example 3 is placed.

FIG. 16 illustrates a configuration example of the dimension measurement system. The dimension measurement system 110 includes an evaluation apparatus 100, a server 101, a database 102, and three input/output apparatuses 103, which are connected by a network. A processing apparatus 111 may not be connected by the network. When connected to the network, the processing apparatus 111 may transmit processing condition data and the like to the evaluation apparatus 100 via the network.

The input/output apparatus 103 may be a terminal including a display and a keyboard, or a PC incorporating a storage medium, such as a hard disk. As illustrated, the input/output apparatus 103 is used by a system operator, such as a measurement engineer using the evaluation apparatus 100, a process engineer using the processing apparatus 111, or a programmer using the server 101 or the database 102. In the following description, the term "input/output apparatus 103" is referred to as a generic term for the input/output apparatus 103-1, the input/output apparatus 103-2, and the input/output apparatus 103-3, and is a description of common features of all of the input/output apparatuses.

The processing apparatus 111 is an apparatus for processing semiconductors or semiconductor devices including a semiconductor. The contents of the processing by the processing apparatus 111 is not particularly limited. For example, the processing apparatus 111 includes a lithography apparatus, a film forming apparatus, and a pattern processing apparatus. The lithography apparatus includes, for example, an exposure apparatus, an electron beam writing apparatus, and an X-ray writing apparatus. The film forming apparatus includes, for example, chemical vapor deposition (CVD), physical vapor deposition (PVD), a deposition apparatus, a sputtering apparatus, and a thermal oxidation apparatus. The pattern processing apparatus includes, for example, a wet etching apparatus, a dry etching apparatus, an electronic beam processing apparatus, and a laser processing apparatus.

The evaluation apparatus 100 is an apparatus that outputs a cross-sectional image as an evaluation result with respect to a sample obtained from a wafer processed in the processing apparatus 111. For example, the evaluation apparatus 100 includes a processing dimension measurement apparatus or an FIB apparatus using an SEM, a transmission electron microscope (TEM), or an optical monitor. The sample obtained from the wafer may be in the form of a sample (coupon) obtained by cutting out a part of a wafer by cleaving, or the entire wafer. A lamella fabricating apparatus may be placed along the path of transfer of a wafer from the processing apparatus 111 to the evaluation apparatus 100. The lamella fabricating apparatus may be used to extract a semiconductor or a part of a semiconductor device as a section, and the extracted sample may be used as the sample be measured.

The server 101 may comprise a conventional computer, and has an OS, a framework necessary for computations for deep learning, libraries, program language, models, etc. installed therein. The server 101 is preferably provided with a high-performance graphics processing unit (GPU) for training the model in a short time. Training of the model and inference are performed by logging into the server 101 from the input/output apparatus 103. The image analysis tool used for manual measurement may be installed in the server 101 or may be installed in any or all of the input/output apparatus 103. When the image analysis tool is installed in the server 101, the tool may be operated from the input/output apparatus 103.

The database 102 is an external storage apparatus for storing captured cross-sectional images as input data, skeleton design rules, automatically generated annotation data, skeleton definition data, model parameters representing the trained model, measurement results and the like.

The measurement engineer, with respect to an image stored in the database 102 that has been obtained by the evaluation apparatus 100, measures dimensions using a commercially available measuring tool from the input/output apparatus 103, and stores the measurement results in the database 102. Further, the process engineer, using the input/output apparatus 103, performs training of the model on the server 101 on the basis of the measurement results. After the model is trained, an image obtained by the evaluation apparatus 100 is directly input into the trained model on the server 101, and the dimensions are automatically measured. As needed, the programmer may correct the program, for example, using the input/output apparatus 103.

It will be appreciated that the above-described work need not be shared by the measurement engineer, the process engineer, and the programmer, and instead the work may be performed by a single system operator independently.

Internal Configuration Example of Server

Figure 17:
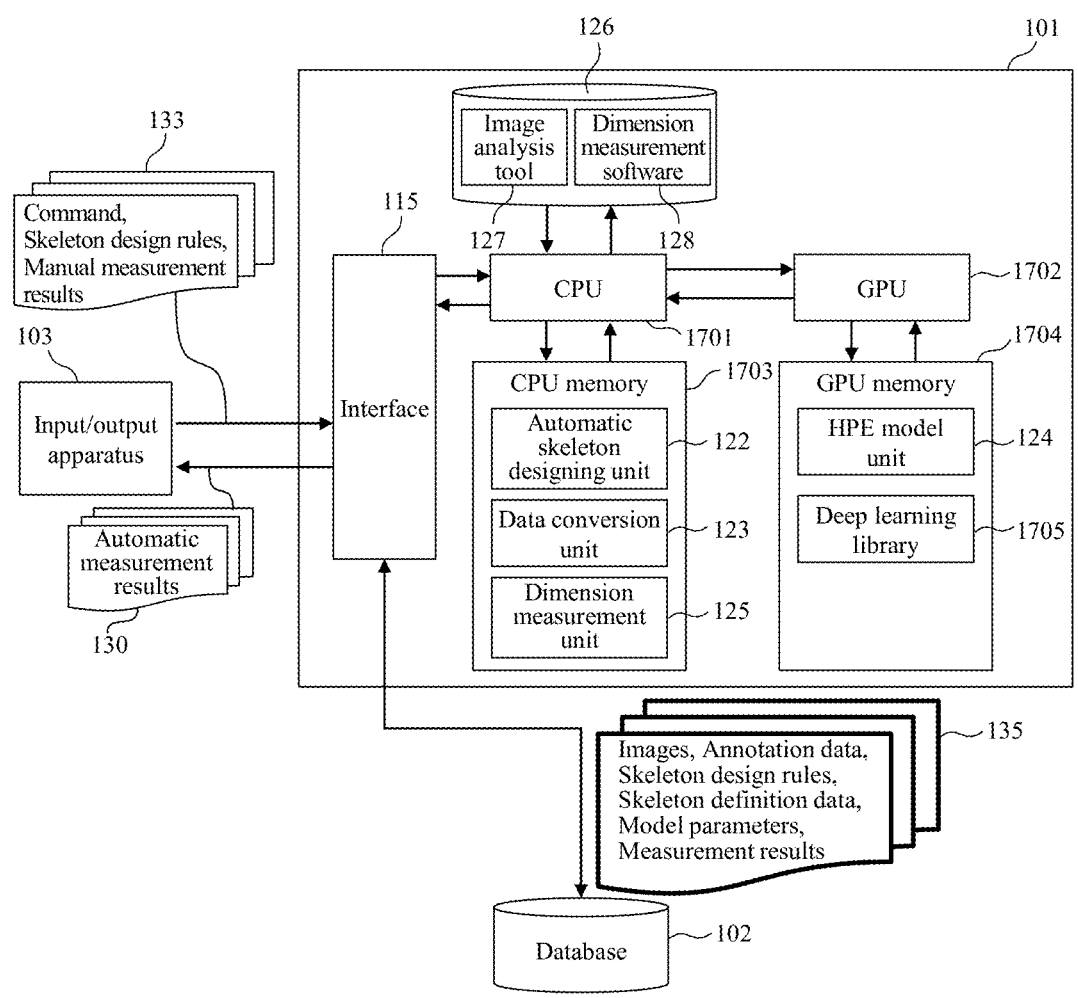
FIG. 17 illustrates an internal configuration example of a server used in the dimension measurement system of Example 3.

FIG. 17 illustrates an internal configuration example of a server 101 (server 101 of FIG. 16) in which the dimension measurement function of the present example is implemented. The server 101 of the present example comprises, for example: an interface 115: a central processing unit (CPU) 1701 for performing dimension measurement using the trained HPE model: a GPU 1702 for parallel-processing the training of the HPE model: a CPU memory 1703 into which an application necessary for dimension measurement is loaded: a GPU memory 1704; and a storage 126 in which the dimension measurement software 128 of the present example is stored.

The dimension measurement software 128 of the present example is provided with an automatic skeleton designing unit 122. When the software is executed, the functional blocks of the automatic skeleton designing unit 122, the data conversion unit 123, and the dimension measurement unit 125 are loaded into the CPU memory 1703 and executed by the CPU 1701. During training of the HPE model, the HPE model unit 124 and a deep learning library 1705 are loaded into the GPU memory 1704, and the parameters of the neural network illustrated in FIG. 2 are optimized. During inference of dimensions with respect to a new image, the dimension measurement unit 125 loads model parameters from the database 102 and delivers them to the HPE model unit 124 to perform dimension measurement. The automatic skeleton designing unit 122, the data conversion unit 123, the dimension measurement unit 125, and the HPE model unit 124 described above are incorporated into the dimension measurement software 128 as software modules.

<HPE Model Training Process>

Figure 18:
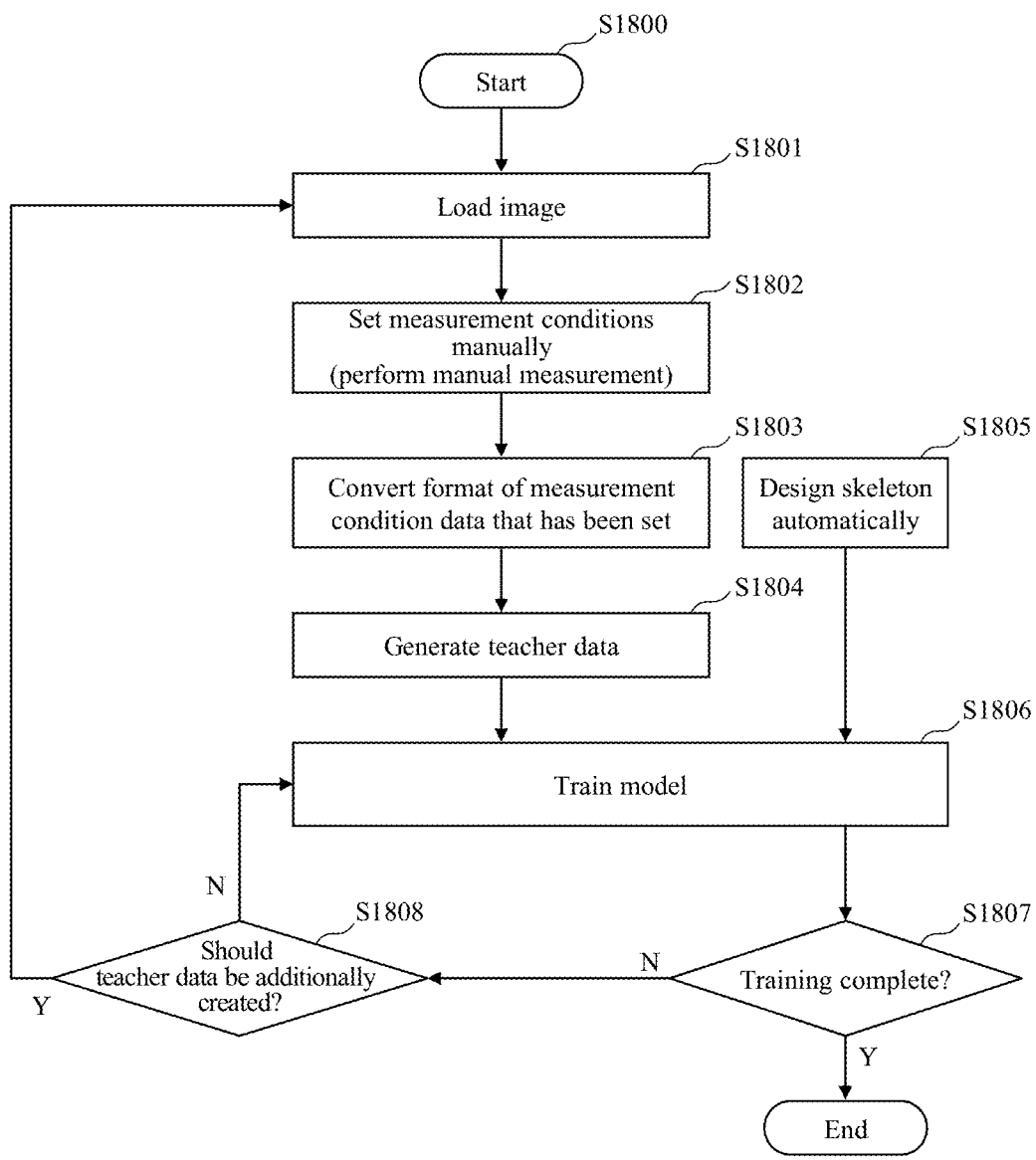
FIG. 18 is a flow chart illustrating a training process for a machine learning model of Example 3.

FIG. 18 is a flowchart for describing the training process for the HPE model of the present example. The object to be measured is a trench pattern, as in Examples 1 and 2. The GUI screen operated by the system operator is also similar to Example 1 (similar to FIG. 4).

(i) Step S1801

As the operator presses the load button 20 of FIG. 4 and selects an image desired to be adopted as teacher data, the HPE model unit 124 loads the selected image.

(ii) Step S1802

Then, the operator performs designation of the measurement location and manual measurement, in the same way as in Example 1. The HPE model unit 124 acquires the measured value list and measurement condition data input by the operator. The measurement condition data comprises data describing the name of the measurement location, and the coordinates of the start point and end point of the measurement location, as in Example 2. If the existing image analysis tool has the function of outputting measurement conditions, that function is used. If not, an add-on for outputting measurement conditions is created and incorporated, also as in Example 2. The format of the measurement condition data output by the manual image analysis tool 127 of the present example is also the same as in Example 2. The above manual measurement is repeated to such an extent that the HPE model can be trained.

(iii) Step S1803

When the manual measurement by the operator is over and sufficient data has been accumulated, the HPE model unit 124, in response to an instruction from the operator, performs the format conversion process by applying the measurement condition data to the conversion module, and creates annotation data. The GUI screen used for performing step S1803 is as depicted in FIG. 9. As the operator presses the conversion module execution button 202 with respect to the selected measurement condition data, the format conversion process is performed. When "Done" is displayed in the status cell 205, the format conversion process of step S1803 is over, and annotation data similar to that of Example 2 is generated.

(iv) Step S1804

When the annotation data is created, the HPE model unit 124 completes the preparation of teacher data comprising the image and the annotation data.

(v) Step S1805

In parallel, the automatic skeleton designing unit 122 automatically generates skeleton definition data on the basis of the measurement condition data and previously input skeleton design rules. The process of step S1805 is started by the operator pressing the automatic skeleton designing module execution button 203 of FIG. 9. The skeleton design rules adopted in the present example are, as in Example 1: (1) No new keypoint is added other than the keypoints set as the measurement locations; (2) A closed polygon is made by connecting the outline keypoints: and (3) An internal skeleton is also made so that a polygon greater than a rectangle is not formed. The design rules are described in a file format that can be processed by the server 101 in advance, such as in Python script, and are registered in the database 102 as rule information. When step S1805 is executed, a file registered in the database 102 is loaded by CPU 1701 and is input into the automatic skeleton designing unit 122.

When the designing of the skeleton definition data is complete, the skeleton definition data is stored in the database 102. Also, "Done" is displayed in the status cell 205 to the right of the automatic skeleton designing module execution button 203 depicted in FIG. 9, and step S1805 ends.

(vi) Step S1806

When the preparation of the teacher data and the skeleton definition data is done, the HPE model unit 124 starts the HPE model training process. When the operator presses the training start button 204 depicted in FIG. 9, training is started. In the training process (step S1806), the teacher data and the skeleton definition data are input into the HPE model unit 124 to perform training.

(vii) Step S1807

When the training is finished to some extent, the HPE model unit 124, in response to an instruction from the operator, performs a confirming operation as to whether training has been completed, in the same way as in Example 1. If it is determined that the training is not completed (No in S1807), the process proceeds to step S1808. On the other hand, if it is determined that the training is completed (Yes in S1807), the HPE model training process ends.

(viii) Step S1808

The HPE model unit 124 determines whether additional creation of teacher data is necessary. If there is a stock of teacher data (and if it is teacher data suitable for training: No in S1808), the HPE model unit 124 performs re-training of the HPE model using that teacher data. If there is no stock of teacher data (Yes in S1808), the HPE model unit 124 determines that teacher data needs to be newly created, and returns to step S1801 to perform the flow of FIG. 18 again.

This completes the description of the training process for the HPE model of the present example. As the method for using the model for which training has been completed is exactly the same as in Example 1 or Example 2, the relevant description is omitted.

According to the dimension measurement system, the dimension measurement method, or the dimension measurement software of the present example, not only the annotation data but also the skeleton definition data can be automatically generated. Thus, it is possible to realize a dimension measurement system, a dimension measurement method, or dimension measurement software that puts less burden on the system user and is more convenient than the dimension measurement system, the dimension measurement method, or the dimension measurement software (program) of Examples 1 and 2. Further, because the skeleton definition data can be automatically generated, it is possible to provide a dimension measurement system, a dimension measurement method, or dimension measurement software (program) that can more quickly adapt to changes in the target device structure or changes in measurement location or measurement pattern.

(D) Example 4

In the present example, a configuration example will be described in which the present example is applied to a charged particle beam apparatus comprising an imaging apparatus, such as a scanning electron microscope, a transmission electron microscope, or a focused ion beam apparatus, and an operating terminal 2002 connected to the imaging apparatus.

<Placement Environment for Charged Particle Beam Apparatus>

Figure 19:
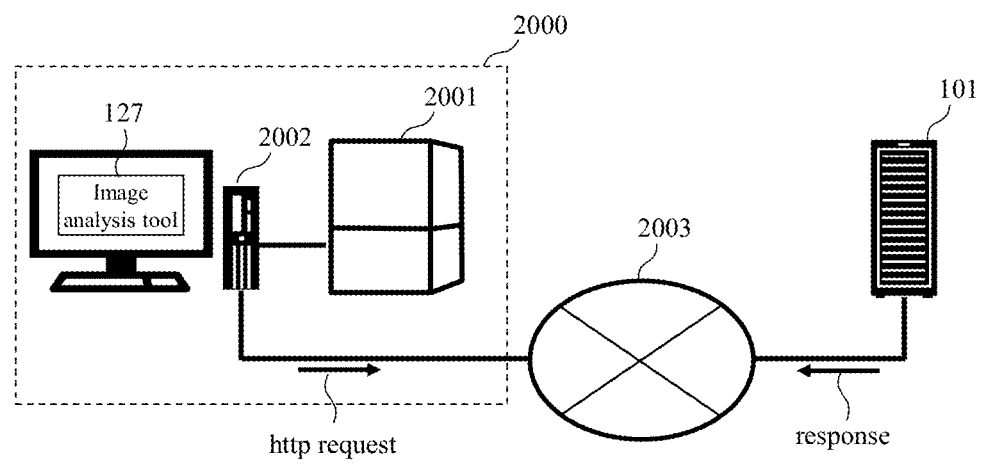
FIG. 19 illustrates a system configuration example of a charged particle beam apparatus of Example 4.

FIG. 19 illustrates a system environment in which a charged particle beam apparatus 2000 of the present example is placed. The charged particle beam apparatus 2000 is provided with an imaging apparatus 2001, the operating terminal 2002, and a manual image analysis tool 127.

The imaging apparatus 2001 is a SEM, a TEM, an FIB apparatus, an FIB-SEM or the like. The operating terminal 2002 is a PC (an external computer as viewed from the server 101) provided with input/output devices such as a keyboard, a mouse, and a display, and incorporating a storage medium such as a hard disk. The operating terminal 2002 is connected to a server 101 (as in Example 3) via a public network (network) 2003, such as the internet. While not illustrated, an evaluation apparatus 100, a processing apparatus 111 and the like similar to those of FIG. 16 are disposed around the server 101, and thus an environment enabling the training of an HPE model is in place. The HPE model stored in the server 101 is already trained. A manual image analysis tool 127 is installed in the hard disk of the operating terminal 2002, and a GUI is displayed on the display. For example, the operator (user) of the operating terminal 2002 loads image data (new data) on which dimension measurement is desired to be performed, and transmits the image data (new object to be measured) to the server 101 via the network 2003. The server 101, as described above, applies the image data to the trained model (pose estimation model), and, after generating the information about the keypoint coordinates and the skeleton data, performs dimension measurement (see FIG. 11). Then, the server 101 transmits dimension measurement results to the operating terminal 2002 via the network 2003. The functions of the manual image analysis tool 127 and its operating method are the same as those described with reference to the foregoing examples, and therefore the relevant description is omitted.

Configuration Example of Image Analysis Tool

Figure 20:
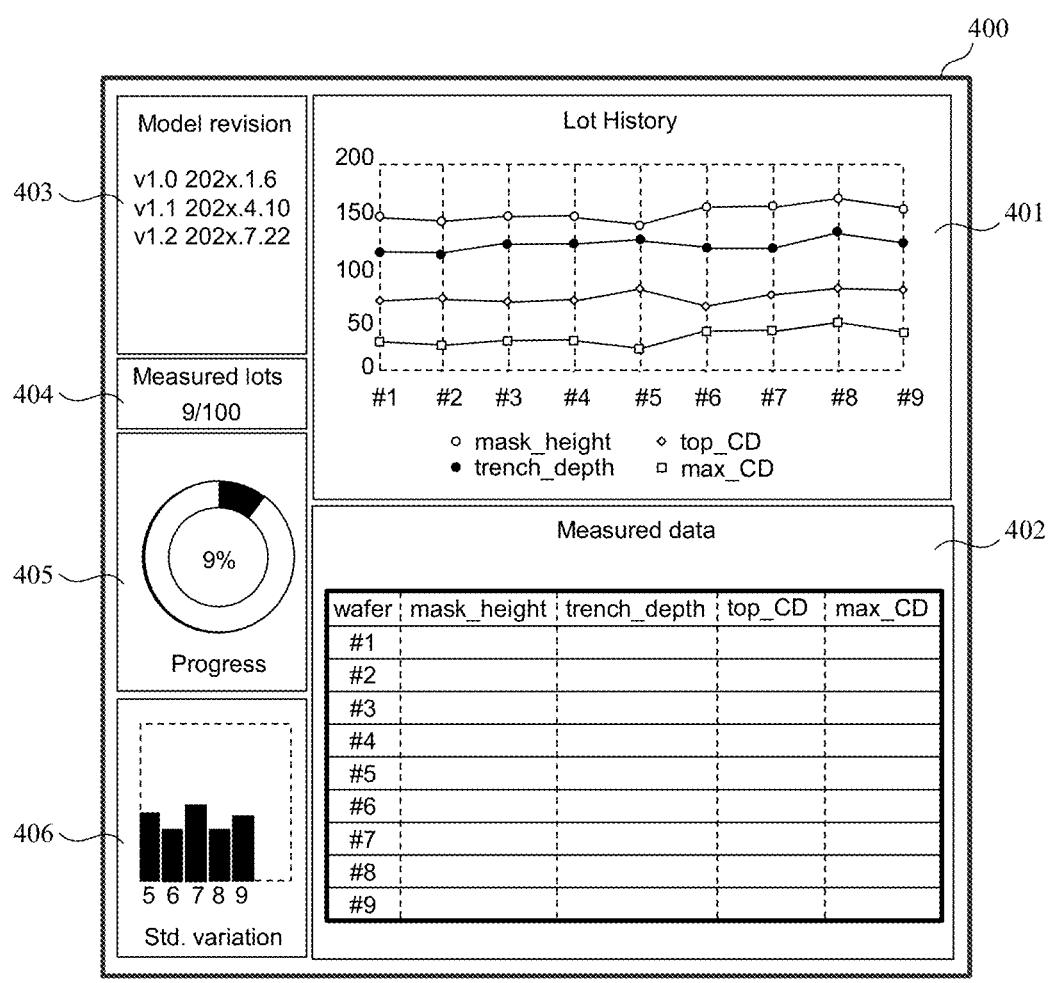
FIG. 20 illustrates a configuration example of a GUI screen of an image analysis tool of Example 4.

FIG. 20 illustrates a configuration example of a dashboard displayed on the GUI of the manual image analysis tool 127. The dashboard 400 illustrated in FIG. 20 comprises a measurement status display panel 401, a measurement result list panel 402, a model modification history display panel 403, a measurement progress status panel 404, a progress status panel 405, a standard deviation transition display panel 406 and the like. The information displayed in the panels is very effective in remotely monitoring how the training of the HPE model stored in the server 101 is progressing, or if there is abnormality in the dimension measurement using the HPE model, for example.

In the GUI illustrated in FIG. 10 which is displayed in the display of the operating terminal 2002, an icon, for example, for calling the dashboard of FIG. 20 is displayed. When the icon is clicked, a hypertext transfer protocol (http) request for calling the dashboard is transmitted from the operating terminal 2002. Then, content data constituting the dashboard is encoded and transmitted from the server 101. Alternatively, the uniform resource locator (url) of a content viewing site may be transmitted from the server 101, without transmitting the content data itself.

While the configuration for displaying the dashboard on the operating terminal 2002 has been described, it is also possible to transmit an image acquired by the imaging apparatus 2001 from the operating terminal 2002 to the server 101 to perform dimension measurement on the image acquired by the imaging apparatus 2001. The results of dimension measurement performed by the server 101 are encoded and returned to the operating terminal 2002. It is also possible to connect a storage medium (such as a hard disk or a RAID array) storing the trained HPE model to the operating terminal 2002 to perform dimension measurement on the image acquired by the imaging apparatus 2001. In this way, the charged particle beam apparatus provided with the dimension measurement function of the present example is realized.

The server 101 may be directly connected to the operating terminal 2002, instead of being remotely connected via a network. Alternatively, a server separate from the remotely connected server 101 may be directly connected to the operating terminal 2002, and the separate server may be placed as a mirror server of the server 101. In these modes of connection, it is possible to realize a charged particle beam apparatus capable of performing not only dimension measurement for a new image, but also training of the HPE model using an image acquired by the imaging apparatus 2001 that has a large volume of data to be handled and puts large loads on information processing and data transmission.

(E) Example 5

In the present example, a configuration example of "a search apparatus for searching for processing parameter values of a semiconductor processing apparatus by means of an estimation model which is determined using, as training data, dimension data measured on the basis of a pose estimation model," is described. This is an example of application to a search apparatus for searching for processing parameter values for obtaining a target processed shape in a semiconductor processing apparatus.

In order to operate the processing apparatus 111 illustrated in FIG. 16, it is necessary to appropriately set various processing parameters for obtaining a target processed shape. For example, in the case of a plasma etching apparatus, the processing parameters may include a bias voltage, a gas flow volume, and a substrate temperature. A set of processing parameters may be referred to as a recipe. Conventionally, recipe setting for a semiconductor processing apparatus has been done relying on the intuition and experience of a skilled process engineer. However, as processes have become more complicated, it is becoming difficult to make quick and optimum recipe setting by human-dependent setting approaches. Thus, recipe searching/setting approaches utilizing AI or machine learning and not relying on humans have been developed.

Meanwhile, in such search apparatuses, there is the problem that it takes time to collect teacher data required for training a machine learning model for recipe search, resulting in the inability to reduce the lead time before the search apparatus becomes operative. Herein, the teacher data for the machine learning model for recipe search is a data set including the images and feature amounts (dimensions) of a good pattern and a defective pattern, and processing parameters when the patterns were obtained. In the case of dimension measurement by the pose estimation model of the present invention, compared to conventional techniques, the end-to-end learning time of the learning model used for dimension measurement is reduced. Accordingly, the time after the training of the model for dimension measurement is started and before execution of automatic measurement becomes possible is reduced, making it possible to reduce the lead time before the search apparatus becomes operative.

The software for realizing the search apparatus described above may be stored in a terminal PC (not shown) connected to the processing apparatus, or in the server 101. When stored in the server 101, for example, recipe search software is stored in the storage 126 illustrated in FIG. 17, training of the recipe search software is performed in the GPU 1702, and the trained recipe search software is executed in the CPU 1701.

While the examples of the present embodiment have been described specifically, the scope of rights according to the present disclosure is not limited to the examples, but includes various modifications and equivalent configurations within the scope and spirit of the claims attached hereto. The examples have been described for facilitating an understanding of the techniques of the present disclosure, and the techniques of the present disclosure are not necessarily limited to an example comprising all of the configurations described. Part of the configuration of one example may be replaced by the configuration of another example, or the configuration of the one example may be incorporated into the configuration of the other example. Part of the configuration of each example may be subjected to addition of another configuration, deletion, or substitution.

The above-described configurations, functions, processing units, processing means and the like may be realized by either hardware or software. Cases of realization by hardware may include, for example, cases where some or all of each of the above-described configurations, functions, processing units, processing means and the like are designed with integrated circuitry. Cases of realization by software may include, for example, cases where a processor interprets and executes a program realizing each function. Information of the programs for realizing the functions, tables, files and the like may be stored in a storage apparatus (storage medium) such as a memory, a hard disk, or a solid-state drive (SSD), or in a recording medium (storage medium) such as an integrated circuit (IC) card, an SD card, or a digital versatile disc (DVD).

The control lines and information lines illustrated are those considered necessary for description, and not necessarily all of the control lines or information lines required for implementation are illustrated. It may be considered that, in practice, almost all of the configurations are mutually connected.

REFERENCE SIGNS LIST

10 Network model for human pose estimation
15 Add-in window
20 Load button
21 Image delete button
22 Magnification cell
23 Characteristics newly create button
24 Characteristics load button
25 Characteristics save button
26 Measurement location name cell
27 Unit cell
28 Color cell
29 Measurement location generate button
30 Measurement location delete button
31 Measured value list
32 Measurement result save button
33 Measurement result load button
40 Mask portion
41 Substrate portion (silicon substrate portion)
42 Measurement location (trench depth)
43 Measurement location (maximum CD)
44 Trench portion
51 Measurement location (mask height)
53 Measurement location (top CD)
61 Keypoint
62 Skeleton
100 Evaluation apparatus
101 Server
102 Database
103 Input/output apparatus (terminal or PC)
110 Dimension measurement system
111 Processing apparatus
115 Interface
116 Processor
117 ROM
118 RAM
124 HPE model unit
125 Dimension measurement unit
126 Storage
127 Manual image analysis tool
128 Dimension measurement software
129 Input data
130 Automatic measurement result
131 Transmission data
132 Input data
133 Input data
135 Transmission data
200 Train tab
201 Measure tab
202 Conversion module execution button
203 Automatic skeleton designing module execution button
204 Training start button
205 Status cell
206 Terminal window
210 Training data storing folder designating button
211 Trained model storing folder designating button
212 Clear button
213 Training data storing folder name cell
214 Trained model storing folder name cell
341 Manual button (individual measuring button)
342 Batch button (collective measuring button)
343 Measurement start button
344 Clear button
345 Input panel
346 Folder name cell
347 File name cell
349 Measurement location definition list
350 Input image panel
351 Measurement result load button
352 Measurement result display clear button
353 Output panel
354 Folder name cell
355 File name cell
356 Pose detection screen (pose estimation result display panel)
357 Dimension measurement result display panel
358 Dimension measurement result cell
400 Dashboard
401 Measurement status display panel
402 Measurement result list panel
403 Model modification history display panel
404 Measurement progress status panel
405 Progress status panel 406 Standard deviation transition display panel
1701 CPU
1702 GPU
1703 CPU memory
1704 GPU memory
1705 Deep learning library
2000 Charged particle beam apparatus
2001 Imaging apparatus
2002 Operating terminal
2003 Public network (network)

The invention claimed is:

1. A computer system for providing a function for: extracting, from image data of a semiconductor pattern, coordinate information about a base point for measuring a dimension of a desired location of the semiconductor pattern; and measuring the dimension using the coordinate information of the base point,
the computer system comprising a training device in which a pose estimation model for outputting the coordinate information of at least two of the base points as a training result is implemented,
wherein the training device is trained in advance using teacher data having image data of the semiconductor pattern as an input and the coordinate information of the at least two base points as an output,
the computer system, with respect to new image data input into the training device, extracting the coordinate information of the at least two base points and the dimension.

2. The computer system according to claim 1, further comprising a storage medium having installed therein an image analysis tool having a function for calculating, through pixel computation, a distance between predetermined locations of the image data designated on a GUI, and a function for outputting coordinate information of the desired locations.

3. The computer system according to claim 2, further comprising a first software module for converting output data of the image analysis tool including the coordinate information, into annotation data constituting the teacher data.

4. The computer system according to claim 2, further comprising a second software module for, using output data of the image analysis tool including the coordinate information, and rule information input in advance, generating definition data of a skeleton structure of the pose estimation model.

5. The computer system according to claim 1, further comprising a display device functioning as a user interface for displaying the image data,
wherein the display device displays, on the user interface, data in which the image data of the semiconductor pattern and the at least two extracted base points are overlapped.

6. The computer system according to claim 5, wherein the display device further displays, in an overlapped manner on the user interface, a skeleton structure of the semiconductor pattern composed of a plurality of connections of a line segment connecting the at least two base points.

7. The computer system according to claim 1, wherein the image data of the semiconductor pattern is a cross-sectional image obtained by a charged particle beam apparatus.

8. A dimension measurement method comprising, using a computer system, extracting, from image data of a semiconductor pattern, coordinate information of a base point for measuring a dimension of a desired location of the semiconductor pattern, and measuring the dimension using the coordinate information of the base point,
the method comprising the computer system inputting, into a pose estimation model trained to automatically design a skeleton including at least two base points on the semiconductor pattern as keypoints, and to output coordinate information of the keypoints, image data of an object to be measured including the semiconductor pattern, and generating coordinate information of the keypoints of the image data that has been input,
and the computer system measuring the dimension using the coordinate information of the keypoints of the image data of the object to be measured,
the pose estimation model being trained using teacher data having the image data of the semiconductor pattern as an input and the coordinate information of the at least two base points as an output.

9. The dimension measurement method according to claim 8, wherein the computer system, using an image analysis tool having a function for calculating, through pixel computation, a distance between predetermined locations of the image data designated on a GUI, measures the dimension with reference to the coordinate information of the at least two base points on the image analysis tool.

10. The dimension measurement method according to claim 9, wherein the image analysis tool further comprises a function for outputting the coordinate information of the desired locations, and
the computer system, during training of the pose estimation model, converts output data of the image analysis tool including the coordinate information into annotation data of the teacher data.

11. The dimension measurement method according to claim 9, wherein the computer system, during training of the pose estimation model, generates, using output data of the image analysis tool including the coordinate information, and rule information input in advance, definition data of a skeleton structure of the pose estimation model.

12. The dimension measurement method according to claim 8, further comprising:
the computer system receiving, via a network, new image data of the object to be measured from an external computer; and
the computer system performing measurement of the dimension of the semiconductor pattern included in the new image data of the object to be measured, and transmitting a result of measurement of the dimension to the external computer.

13. A storage medium storing a program for causing a computer to realize a dimension measurement function for: extracting, from image data of a semiconductor pattern, coordinate information of a base point for measuring a dimension of a desired location of the semiconductor pattern; and measuring the dimension using the coordinate information,
the program including a program code for realizing a training device describing a pose estimation model for outputting coordinate information of at least two of the base points as a training result,
wherein the training device has an input layer having the image data of the semiconductor pattern as an input, and an output layer outputting the coordinate information of the at least two base points, and
the pose estimation model is capable of being trained using teacher data that has the image data of the semiconductor pattern as an input and the coordinate information of the at least two base points as an output.

14. The storage medium according to claim 13, wherein
the program has a program code for converting output data of the image analysis tool including the coordinate information, into annotation data of the teacher data, and
the image analysis tool has a function for calculating, through pixel computation, a distance between predetermined locations of the image data designated on a GUI.

15. The storage medium according to claim 13, wherein
the program has a program code for generating, using output data of the image analysis tool including the coordinate information and rule information input in advance, definition data of a skeleton structure of the pose estimation model, and
the image analysis tool has a function for calculating, through pixel computation, a distance between predetermined locations of the image data designated on a GUI.

* * * * *